United States Patent
Tatsumi et al.

(10) Patent No.: US 8,823,209 B2
(45) Date of Patent: Sep. 2, 2014

(54) CONTROL OF SEMICONDUCTOR DEVICES TO SELECTIVELY SUPPLY POWER TO POWER DOMAINS IN A HIERARCHICAL STRUCTURE

(75) Inventors: Masahiro Tatsumi, Yokohama (JP); Takashi Shikata, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 88 days.

(21) Appl. No.: 12/788,114

(22) Filed: May 26, 2010

(65) Prior Publication Data

US 2010/0231044 A1  Sep. 16, 2010

Related U.S. Application Data

(63) Continuation-in-part of application No. 12/394,741, filed on Feb. 27, 2009, now abandoned.

(30) Foreign Application Priority Data

Jun. 20, 2008 (JP) ................................. 2008-162335
Jun. 22, 2009 (JP) ................................. 2009-148066

(51) Int. Cl.
G06F 1/26 (2006.01)
G06F 1/32 (2006.01)
H02J 9/00 (2006.01)
H03K 19/00 (2006.01)

(52) U.S. Cl.
CPC .............. *G06F 1/3203* (2013.01); *G06F 1/26* (2013.01); *G06F 1/3287* (2013.01); *H02J 9/005* (2013.01); *H03K 19/0008* (2013.01); *H03K 19/0016* (2013.01); *Y02B 60/1278* (2013.01); *Y02B 60/1282* (2013.01)
USPC .............................................. 307/41; 307/39

(58) Field of Classification Search
CPC .................................. G06F 1/26; G06F 1/3203
USPC ...................................................... 307/39, 41
See application file for complete search history.

(56) References Cited

U.S. PATENT DOCUMENTS 6,124,749 A * 9/2000 Morishima .................... 327/390
6,792,553 B2 * 9/2004 Mar et al. ...................... 713/330

(Continued)

FOREIGN PATENT DOCUMENTS

JP 2001-184142 7/2001
JP 2003-209616 A 7/2003
JP 2006-344640 A 12/2006

OTHER PUBLICATIONS

English-language translation of Japanese Office Action dated Feb. 22, 2013 in corresponding Japanese Application No. 2009148066.

(Continued)

*Primary Examiner* — Adi Amrany
(74) *Attorney, Agent, or Firm* — Arent Fox LLP

(57) ABSTRACT

A power controlling circuit is assigned to each of a plurality of power domains of which power may be on/off-controlled, and which have a first hierarchical structure included in a semiconductor device, and these power controlling circuits are connected in accordance with a second hierarchical structure corresponding to the first hierarchical structure, and thereby, a power management unit controlling power supply to the plurality of power domains is configured, as a result that the power management unit performing power supply control depending on power control specification may be designed easily.

18 Claims, 31 Drawing Sheets

(56) References Cited

U.S. PATENT DOCUMENTS

| | | | |
|---|---|---|---|
| 6,802,014 B1* | 10/2004 | Suurballe | 713/300 |
| 7,135,789 B2* | 11/2006 | Boros et al. | 307/43 |
| 7,142,019 B2* | 11/2006 | Mair et al. | 326/96 |
| 7,305,639 B2* | 12/2007 | Floyd et al. | 716/112 |
| 7,519,838 B1* | 4/2009 | Suurballe | 713/300 |
| 7,610,572 B2* | 10/2009 | Kanno et al. | 716/138 |
| 7,659,746 B2* | 2/2010 | Chua-Eoan et al. | 326/83 |
| 7,673,163 B2 | 3/2010 | Tsukimori et al. | |
| 7,760,011 B2* | 7/2010 | Wang et al. | 327/544 |
| 7,770,037 B2* | 8/2010 | Searles et al. | 713/300 |
| 7,793,130 B2* | 9/2010 | Yang et al. | 713/323 |
| 8,219,843 B2* | 7/2012 | Cheng et al. | 713/330 |
| 8,362,805 B2* | 1/2013 | Suzuki et al. | 326/93 |
| 8,421,499 B2* | 4/2013 | Takayanagi et al. | 326/33 |
| 2004/0263237 A1* | 12/2004 | Kim et al. | 327/530 |
| 2006/0184808 A1* | 8/2006 | Chua-Eoan et al. | 713/300 |
| 2007/0101174 A1 | 5/2007 | Tsukimori et al. | |
| 2007/0109833 A1* | 5/2007 | Pyeon et al. | 365/63 |
| 2009/0204837 A1* | 8/2009 | Raval et al. | 713/330 |
| 2009/0228324 A1* | 9/2009 | Ambrosio et al. | 705/10 |
| 2009/0259982 A1* | 10/2009 | Verbeure | 716/13 |
| 2010/0321588 A1* | 12/2010 | Sugihara et al. | 348/730 |

OTHER PUBLICATIONS

Japanese Office Action dated Feb. 22, 2013 in corresponding Japanese Application No. 2009148066.

* cited by examiner

F I G. 16
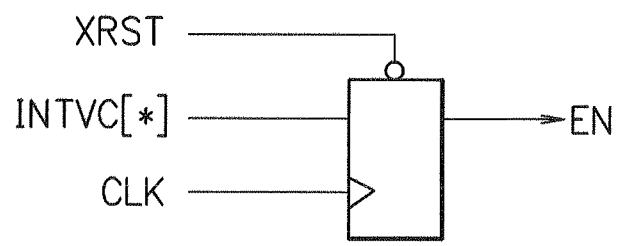

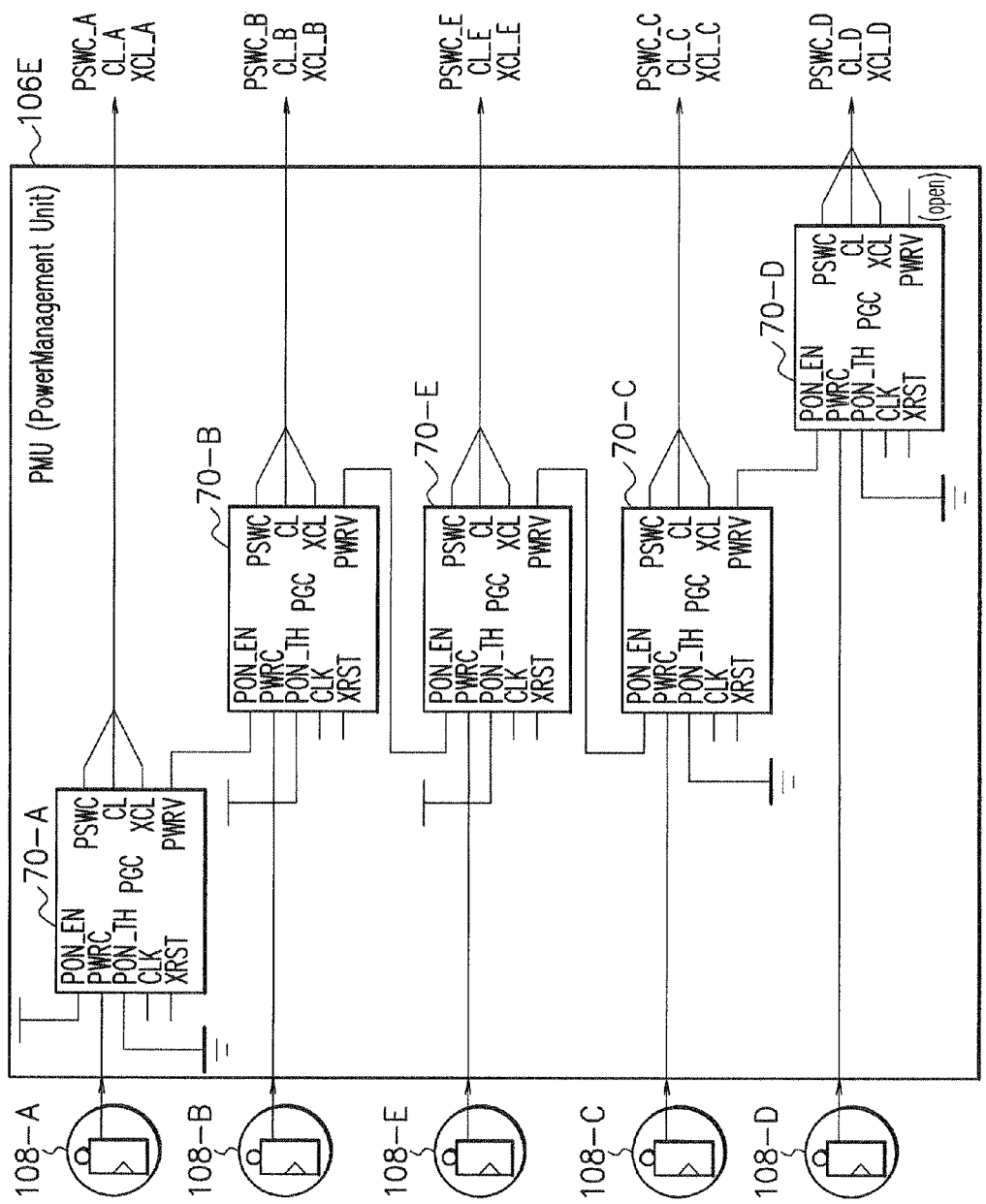
F I G. 22

F I G. 26
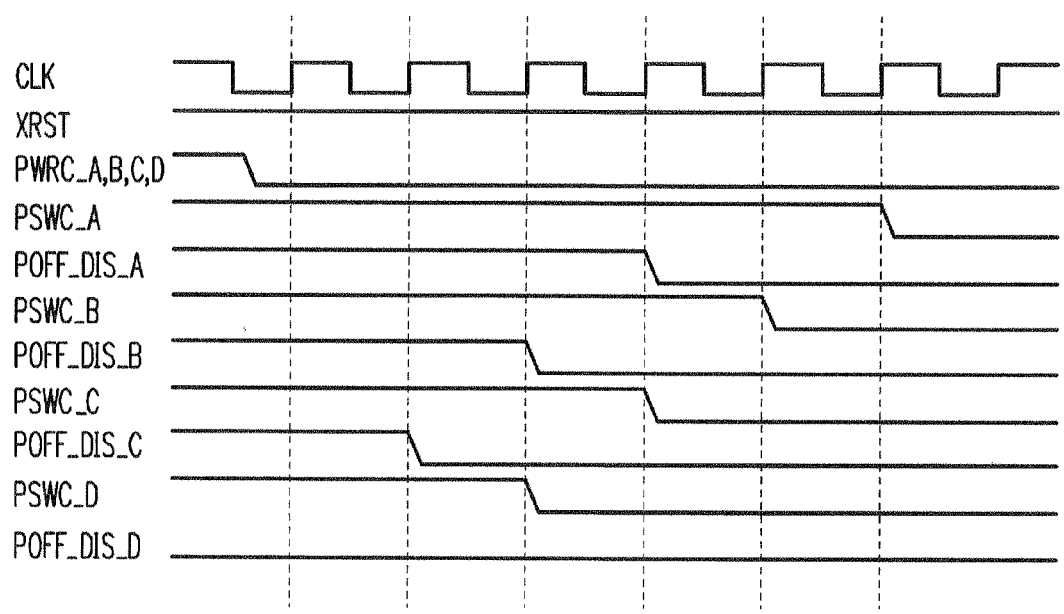

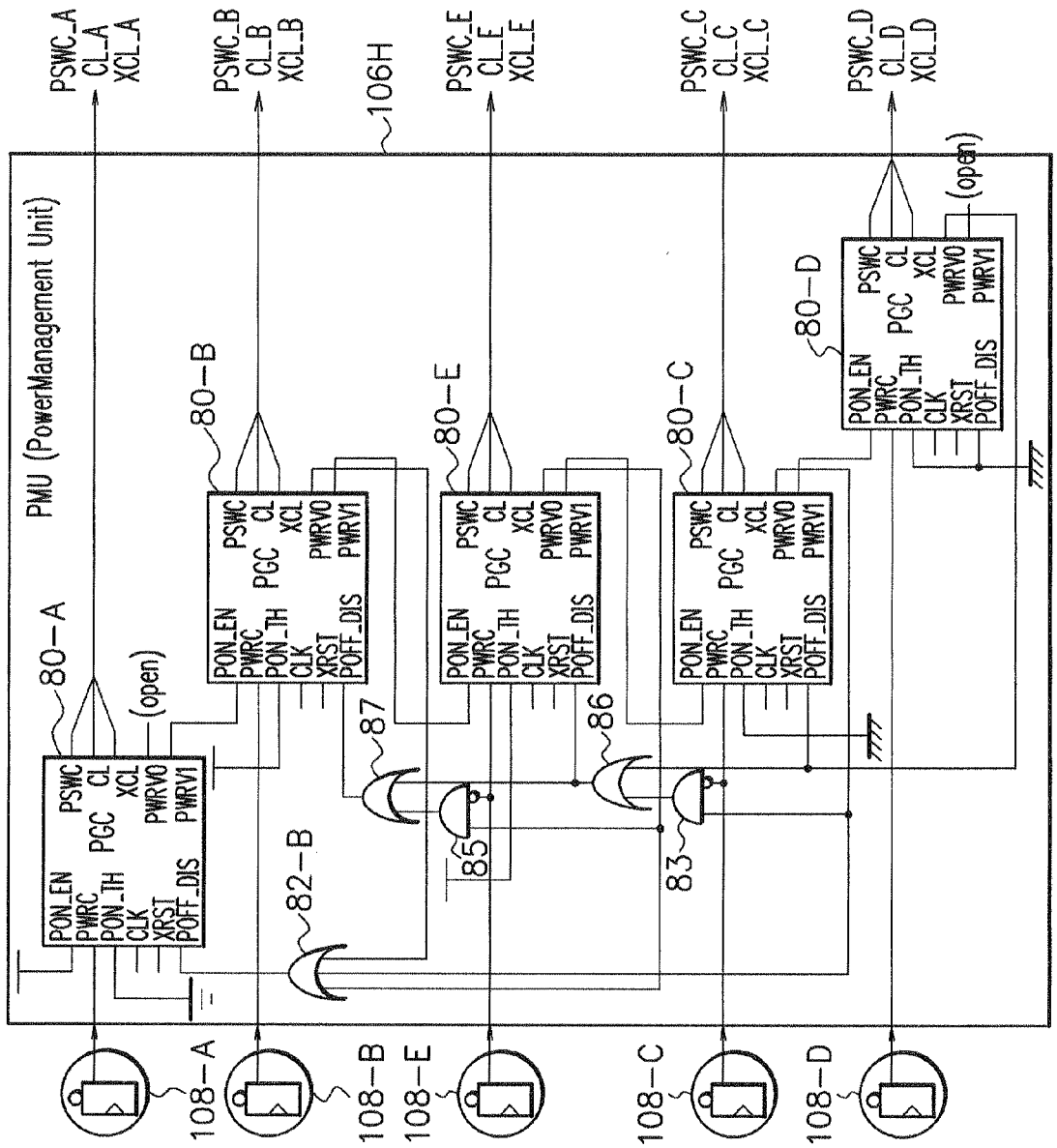
F I G. 29

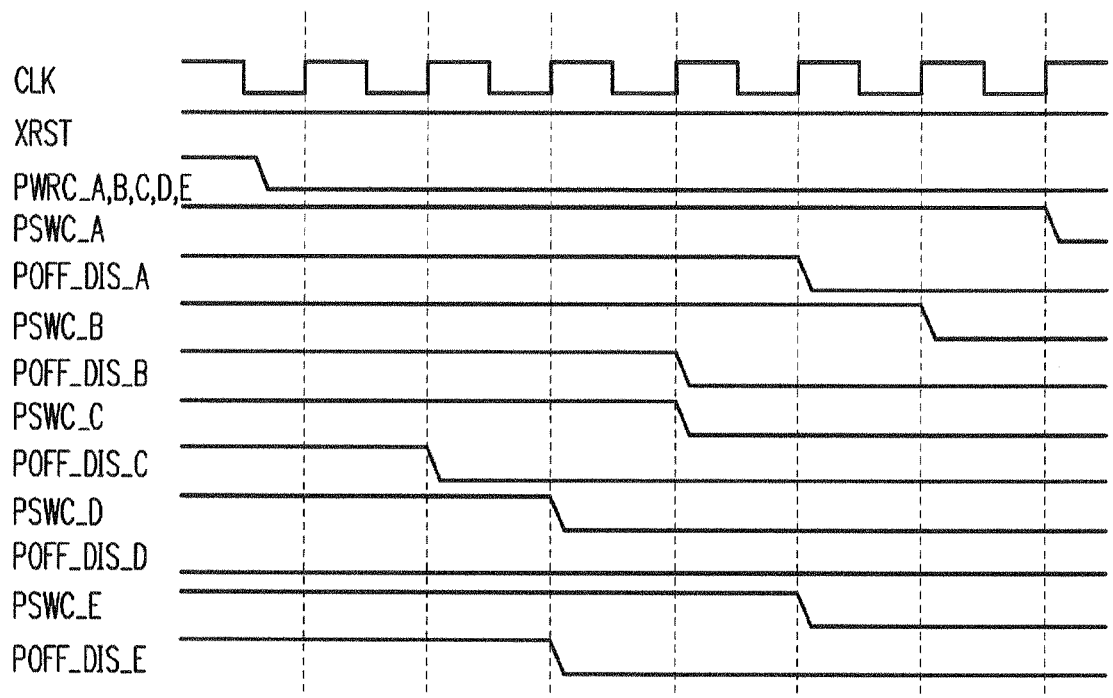
F I G. 30

CONTROL OF SEMICONDUCTOR DEVICES TO SELECTIVELY SUPPLY POWER TO POWER DOMAINS IN A HIERARCHICAL STRUCTURE

CROSS-REFERENCE TO RELATED APPLICATIONS

This is a continuation-in-part application of application Ser. No. 12/394,741, filed Feb. 27, 2009.

This application is based upon and claims the benefit of priority of the prior Japanese Patent Application No. 2008-162335, filed on Jun. 20, 2008, and the Japanese Patent Application No. 2009-148066, filed on Jun. 22, 2009, the entire contents of which are incorporated herein by reference.

FIELD

The present embodiments relate to a semiconductor device including a plurality of power domains.

BACKGROUND

In resent years, a leakage current has not been able to be ignored in a semiconductor device (semiconductor integrated circuit) such as an LSI according to microfabrication of process technique. Japanese Laid-open Patent Publication No. 2003-209616 discloses power gating (PG) technique of which power to a block is on/off-controlled has been applied in order to reduce leakage electric power by cutting off power supply to the block not in use inside the semiconductor device.

In applying the power gating technique to the semiconductor device, a power switch to switch whether or not to perform power supply to an internal power domain (the block) is controlled by a power management unit (PMU).

Further, Japanese Laid-open Patent Publication No. 2006-344640 discloses when power of a first power domain inside a semiconductor device is off, power of a second power domain where a signal from a circuit in the first power domain is input is made to be on, and thereby, an indefinite value signal including an intermediate potential is led to be applied to a circuit in the second power domain. As a result, the circuit in the second power domain operates erroneously, and an unintended leakage current (a short-circuit current) flows therethrough. Accordingly, when the plurality of power domains exist, providing a circuit to prevent the indefinite value signal from propagating, and a rule regarding the sequence of supplying power (start sequence) are to be needed.

Thus, power control specification such that how the power domains inside the semiconductor device are configured, or in what sequence power is supplied (the start sequence), or the like differs in each of the semiconductor devices, and therefore, a design for the power management unit fitting specification is needed by each of the semiconductor devices. However, in the case when the number of products of the semiconductor device to which the power gating technique is applied increases, and in the case when the power gating technique is applied to an ASIC (Application Specific Integrated Circuit) and a COT (Customer Owned Tooling) business, designing the power management unit suitable for the specification of each of the products by every product development results in a significant problem in terms of development efficiency and design man-hours.

SUMMARY

According to one point of view of the embodiments, there is provided a semiconductor device including: a plurality of power domains of which power is allowed to be on/off-controlled; and a power management unit controlling power supply to the plurality of power domains. The power management unit includes a plurality of power gating circuits provided one by one corresponding to each of the power domains, and the plurality of power gating circuits are connected in accordance with inclusion relation of the power domains.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 16 is a view depicting one example of a counter circuit to adjust a signal change time;

FIG. 22 is a view depicting another configuration example of the power management unit in the seventh embodiment;

FIG. 26 is a view depicting one example of an operational waveform of the power management unit depicted in FIG. 25;

FIG. 29 is a view depicting another configuration example of the power management unit in the eighth embodiment; and FIG. 30 is a view depicting one example of an operational waveform of the power management unit depicted in FIG. 29.

DESCRIPTION OF EMBODIMENTS

Hereinafter, embodiments are explained based on the drawings.

Figure 1:
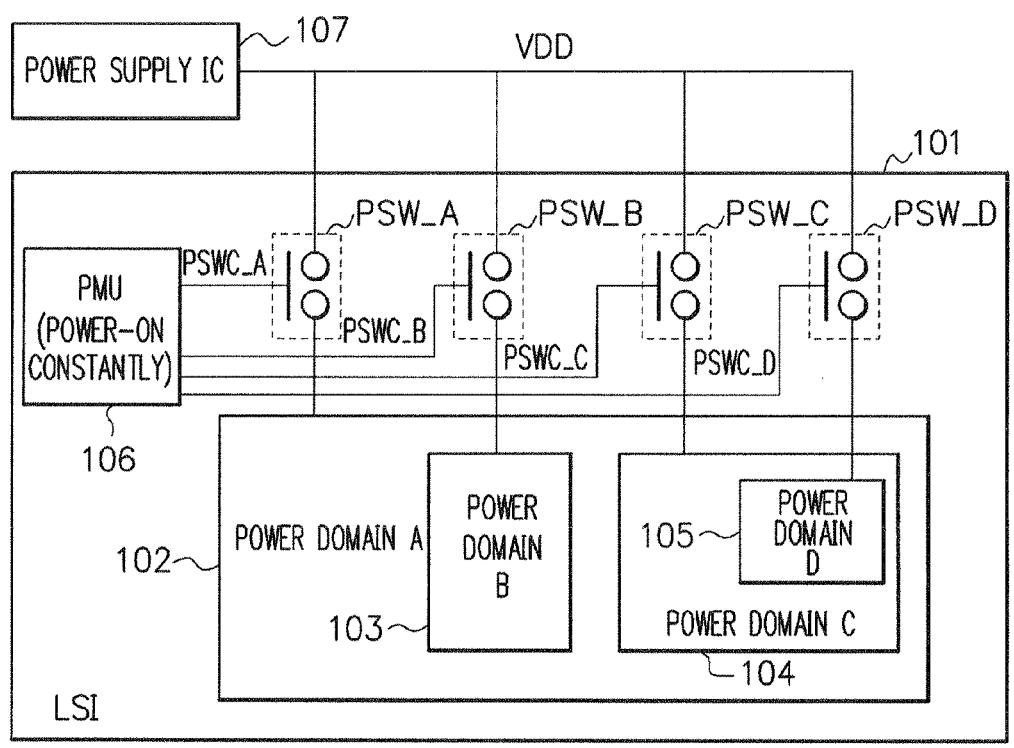
FIG. 1 is a view depicting a configuration example of a semiconductor device according to the present embodiments.

FIG. 1 is a view depicting one configuration example of a semiconductor device (for example, an LSI, and the like) according to the present embodiments. FIG. 1 depicts a configuration of the case when a power management unit (PMU) 106 performs on/off control of power according to four power domains of a power domain A 102, a power domain B 103, a power domain C 104, and a power domain D 105 inside a semiconductor device 101 as one example.

In the semiconductor device 101, the power domain A 102 to the power domain D 105 are for an object for the on/off control of power, namely an object for power gating control. Domains except the power domain A 102 to the power domain D 105 are power domains (called constant on-domains) in an on state made by which power is supplied constantly from a power supply IC 107 to supply power. The power management unit 106 is disposed in the constant on-domain.

Supplying power to the power domain A 102 to the power domain D 105 each from the power supply IC 107 is performed via power switches PSW_A, PSW_B, PSW_C, and PSW_D having a switching function. Each of the power switches PSW_A, PSW_B, PSW_C, and PSW_D is configured by, for example, a transistor.

The power switches PSW_A, PSW_B, PSW_C, and PSW_D are on/off-controlled respectively by control signals PSWC_A, PSWC_B, PSWC_C, and PSWC_D output from the power management unit 106. Thereby, it makes it possible to switch whether to perform or cut off power supply to the power domain A 102 to the power domain D 105, and the power gating control related to each of the power domains may be performed.

Here, in the example of the semiconductor device 101 depicted in FIG. 1, the configuration of the power domains is in a hierarchical shape. The power domain C 104 includes the power domain D 105. The power domain A 102 includes the power domain B 103 and the power domain C 104 (including the power domain D 105).

Therefore, power has to be supplied to the power domain C 104 and the power domain A 102 in order that a signal generated in a logic circuit inside the power domain D 105 is employed in other power domains (for example, the power domain A, the power domain B, and the power domain C, and the constant on-domain). Further, power has to be supplied to the power domain A 102 in order that signals generated in logic circuits inside the power domain B 103 and the power domain C 104 are similarly employed in other power domains (for example, the power domain A, the constant on-domain).

In a word, in the case when inclusion relation of the power domains exists, as on/off relation between the power domains at the time of circuit operation, in general, power of the power domain on an including side is needed to be on when power of the power domain on an included side is on. In other words, in the case when the configuration of the power domains is in the hierarchical shape, power is generally supplied according to a hierarchical structure thereof.

Accordingly, in the example depicted in FIG. 1, power supply to the power domain A 102 is started simultaneously with, or after power supply to the power domain A 102 is started, power supply to the power domain B 103 is started. Similarly, power supply to the power domain A 102 is started simultaneously with, or after power supply to the power domain A 102 is started, power supply to the power domain C 104 is started. Further, power supply to the power domain C 104 is started simultaneously with, or after power supply to the power domain C 104 is started, power supply to the power domain D 105 is started.

Figure 2:
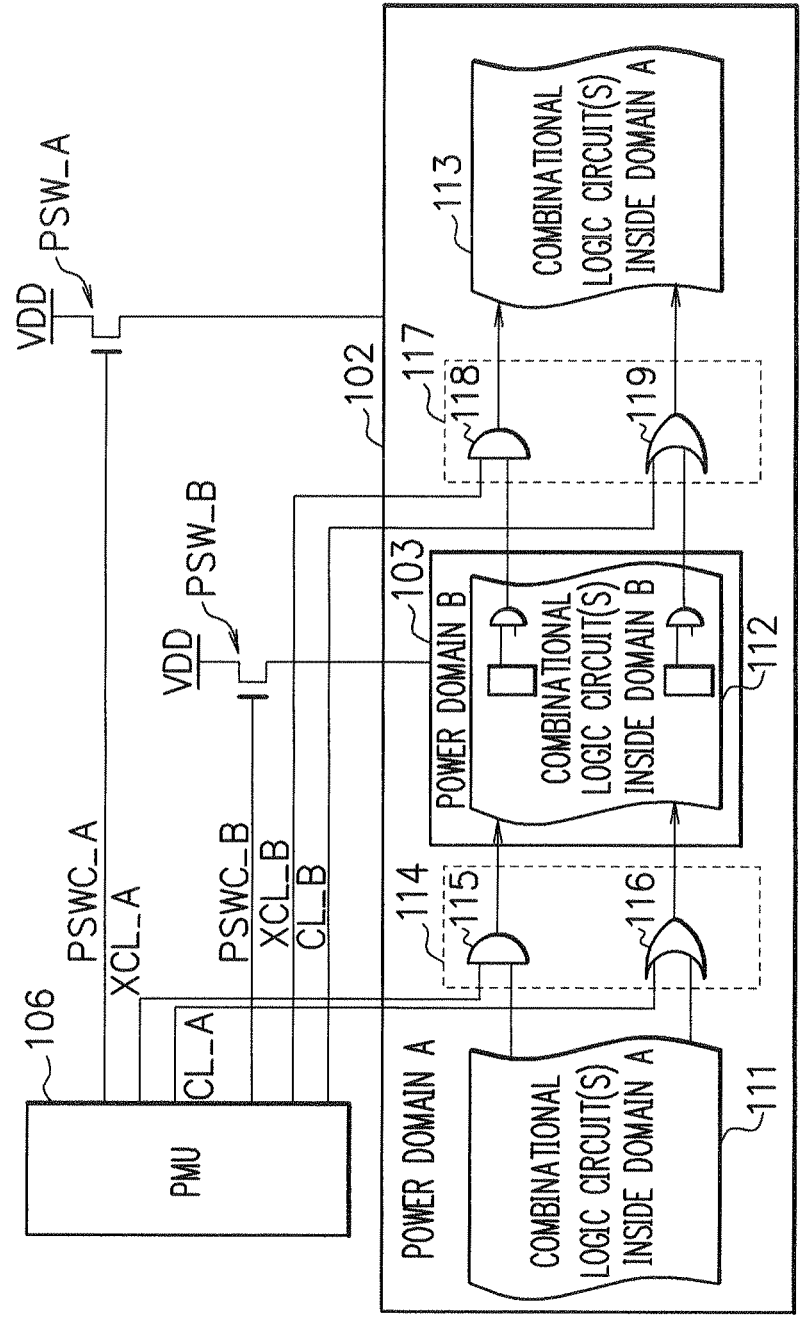
FIG. 2 is an explanatory view regarding input/output signals and control signals of a portion of a power domain B in FIG. 1.

There is depicted a detailed explanatory view related to signals input/output to/from the power domain A 102 and control signals from the power management unit 106 in FIG. 2 focused on a portion of the power domain B 103 depicted in FIG. 1. Note that the power domains except the power domain A 102, the power domain B 103 (for example, the constant on-domain and the power domain C, the power domain D) are omitted in FIG. 2.

Power to the power domain A 102 is supplied via the power switch PSW_A, and power to the power domain B 103 is supplied via the power switch PSW_B. The power switch PSW_A is on/off-controlled depending on the control signal PSWC_A supplied from the power management unit 106, and the power switch PSW_B is on/off-controlled depending on the control signal PSWC_B supplied from the power management unit 106.

Note that the power switches PSW_A, PSW_B are configured by using a p-MOS-type transistor in FIG. 2, but the power switches PSW_A, PSW_B may be configured by using an n-MOS-type transistor. Further, the power switches PSW_A, PSW_B are provided on a VDD power supply side, but the power switches PSW_A, PSW_B may be provided on a VSS power supply (ground power supply) side as well. That is, the power switches PSW_A, PSW_B may be provided at least on either one of the VDD power supply side and the VSS power supply side so that the on/off control of power is performed.

A clamp circuit (an isolator) 114 is interposed in a signal passed from a logic circuit 111 inside the power domain A 102 to a logic circuit 112 inside the power domain B 103 in FIG. 2. Similarly, a clamp circuit (an isolator) 117 is interposed in a signal passed from the logic circuit 112 inside the power domain B 103 to a logic circuit 113 inside the power domain A 102.

There are generally often employed AND (logical product operation)-type clamp cells 115, 118, and OR (logical sum operation)-type clamp cells 116, 119 in the clamp circuits 114, 117. The AND-type clamp cells 115, 118 are in order to clamp (mask) the signal by a potential corresponding to a logical value "0" based on clamp signals XCL_A, XCL_B. Further, the OR-type clamp cells 116, 119 are in order to clamp (mask) the signal by a potential corresponding to a logical value "1" based on clamp signals CL_A, CL_B.

The clamp circuit 117 is in order to clamp (mask) the signal in the case when, for example, the power domain A 102 is in a power supply state (an operating state) while power of the power domain B 103 is off. Concretely, the clamp circuit 117 functions not to carry an indefinite value signal such as an intermediate potential from the circuit inside the power domain B 103 whose power is off to the circuit inside the power domain A 102 in the power supply state (operating state). Thereby, an erroneous operation of the internal circuit is prevented and an unintended short-circuit current is prevented from flowing in the power domain A 102.

Further, the clamp circuit 114 is a circuit that is necessary in the case when it is configured in a manner that, for example, a retention RAM, and the like is included inside the power domain B 103, and the power supply only to the power management unit 106 and the power domain B 103 is maintained at the time of the entire semiconductor device being on standby, or the like. In the case when there is only a normal logic circuit inside the power domain B 103, generally power of the power domain A 102 is on when power of the power domain B 103 is on, resulting that the clamp circuit 114 does not have to be provided.

Note that cases where the semiconductor device 101 depicted in FIG. 1 is applied are described in each of the embodiments that are explained below as one example, but the present embodiments are not limited to these. For example, the configuration of the power domain inside the semiconductor device (the number of power domains of the object for the power gating control, the inclusion relation thereof, and the like) is arbitrary, which is not limited to the configuration depicted in FIG. 1.

First Embodiment

A first embodiment is explained.

Figure 3:
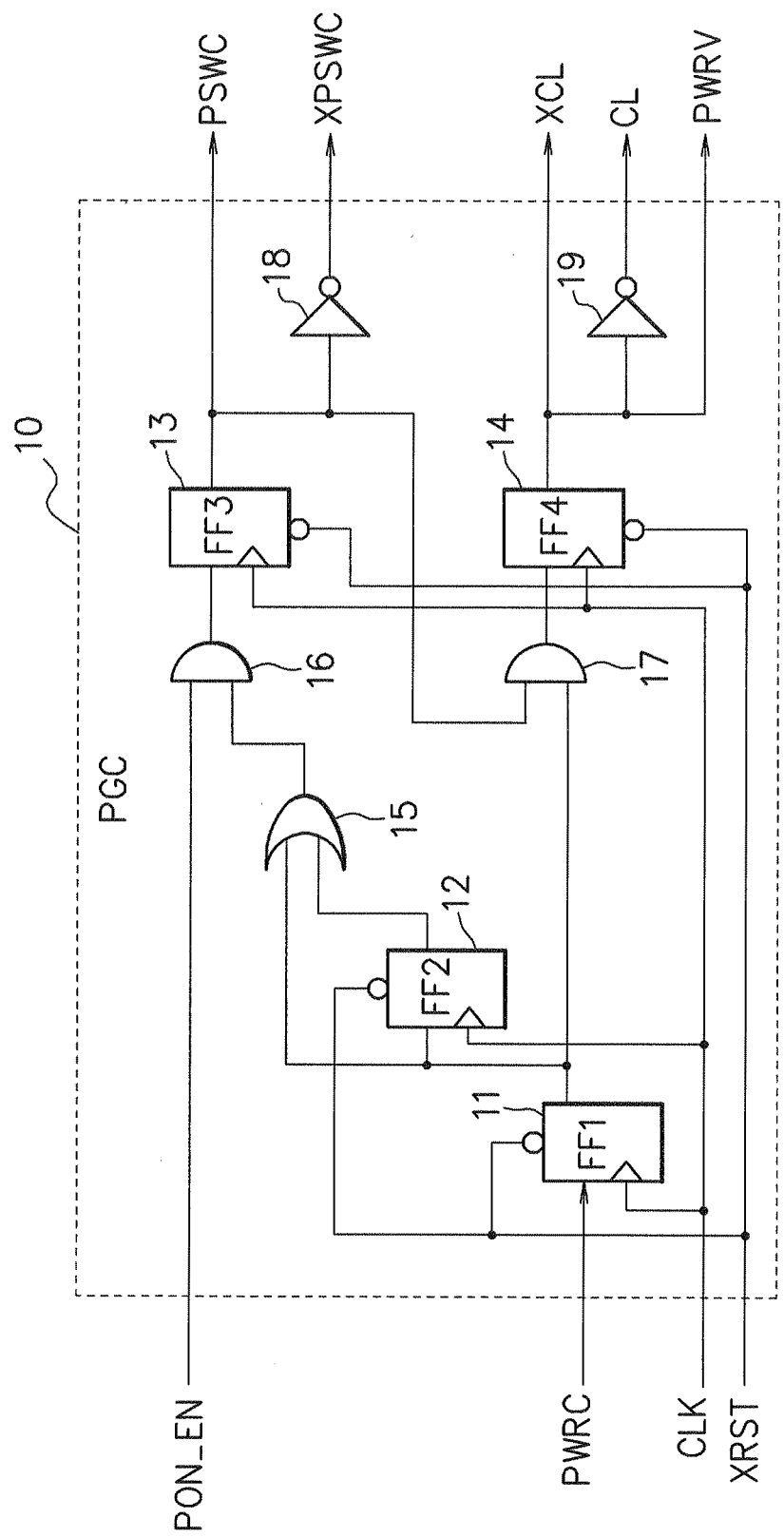
FIG. 3 is a circuit diagram depicting a configuration example of a power gating circuit in a first embodiment.

FIG. 3 is a circuit diagram depicting a configuration example of a power gating circuit (PGC) in the first embodiment. The power gating circuit in this embodiment is provided one by one to each of the power domains of the object for the power gating control, and the power gating circuits are connected depending on power control specification of a semiconductor device, and thereby a power management unit is configured (the above is similarly applied to each of the embodiments that are described later).

A power gating circuit 10 as depicted in FIG. 3 includes flip-flops (FF) 11, 12, 13, and 14, a logical sum operation circuit (an OR circuit) 15, logical product operation circuits (AND circuits) 16, 17, and inverters 18, 19. A clock signal CLK, a reset signal XRST, a power-on/off control signal PWRC, and a power supply enable signal PON_EN are input to the power gating circuit 10.

The flip-flops 11 to 14 have the clock signal CLK supplied thereto, and operate in synchronization with the clock signal CLK. Further, the reset signal XRST is supplied to the flip-flops 11 to 14. The flip-flops 11, 12 are preset to an initial value "1" by the reset signal XRST, and the flip-flops 13, 14 are reset to an initial value "0" by the reset signal XRST.

Resetting is performed in this embodiment when the reset signal XRST is at a low level ("L"). As the reset signal XRST, for example, a power-on reset signal of the semiconductor device is employed, but, the reset signal is not limited to this, and a reset signal except the power-on reset signal may be employed.

The power-on/off control signal PWRC is input to the flip-flop 12, the OR circuit 15, and the AND circuit 17 via the flip-flop 11. The power-on/off control signal PWRC is to request power-on and power-off to the corresponding power domain. In the case when power-on is requested, the power-on/off control signal PWRC is at a high level ("H"), and in the case when power-off is requested, the power-on/off control signal PWRC is at "L". Incidentally, the power-on/off control signal PWRC may be input directly to the flip-flop 12, the OR circuit 15, and the AND circuit 17 without the flip-flop 11 being provided.

The OR circuit 15 has an output from the flip-flop 11 and an output from the flip-flop 12 input thereto, and outputs an operation result thereof. The AND circuit 16 has the power supply enable signal PON_EN and an output from the OR circuit 15 input thereto, and outputs an operation result thereof. The power supply enable signal PON_EN is to indicate whether or not power supply to the corresponding power domain is allowed. In the case when the power supply is allowed, the power supply enable signal PON_EN is at "H", and in the case when the power supply is not allowed, the power supply enable signal PON_EN is at "L".

The flip-flop 13 has an output from the AND circuit 16 input thereto. An output from the flip-flop 13 is output as a positive control signal PSWC, and is output via the inverter 18 as a negative control signal XPSWC. The control signals PSWC, XPSWC are to control the power switch performing the power supply to the corresponding power domain. Incidentally, both of the positive and negative control signals PSWC, XPSWC are not always needed to be output, and only the control signal of either positive polarity or negative polarity may be output depending on the power switch to be controlled (in the embodiments that are explained later, only the positive control signal PSWC is depicted, and the negative control signal XPSWC is omitted).

The AND circuit 17 has the output from the flip-flop 11 and the output from the flip-flop 13 input thereto, and outputs an operation result thereof. The flip-flop 14 has an output from the AND circuit 17 input thereto. An output from the flip-flop 14 is output as a negative clamp signal XCL and a valid signal PWRV, and is output via the inverter 19 as a positive clamp signal CL.

The clamp signals CL, XCL are to clamp (mask) an output signal of the corresponding power domain when power of the corresponding power domain is off, and the clamp signals CL, XCL are employed according to clamping the signal by a potential corresponding to either the logical value "0" or the logical value "1." The clamp signals CL, XCL are supplied to the clamp circuits 114, 117 depicted in FIG. 2. Further, the clamp signals CL, XCL may be employed as the control signals for the clock signal CLK and the reset signal XRST supplied to the corresponding power domain.

Further, the valid signal PWRV is to indicate that power is supplied to the corresponding power domain, namely power of the corresponding power domain turns to on. In the example depicted in FIG. 3, the circuit configuration in which the valid signal PWRV changes at the same timing as the clamp signal XCL is applied, but a signal made after the clamp signal XCL is accessed to the flip-flop again may be output as the valid signal PWRV.

Here, as for the clock signal CLK supplied to the power gating circuit 10, it is common that a generally used clock signal with a frequency of 32 KHz or so for counting time of a clock is employed, but a clock signal with other frequencies except the above may be employed. However, after the power switch is turned on, a predetermined time period is necessary until the signal indicating "H" inside the circuit reaches the potential indicating the logical value "1" in positive logic after the power supply to the actual circuit is started. Therefore, it is preferable to supply not a high-speed clock signal with a frequency of such as dozens of MHz but a slow clock signal of KHz order in some degree to the clock signal CLK.

Further, when the entire semiconductor device is in a standby state, it is better that the frequency of the clock signal CLK is as low as possible, and further it is preferable that both edges of the clock signal CLK are employed in order to decrease power consumption of the power management unit in which power is constantly on. In the example depicted in FIG. 3, each of the flip-flops 11 to 14 is depicted to operate in synchronization with a rising edge of the clock signal CLK, but a cycle of the clock signal CLK may be double of the cycle needed (half of the frequency) so that, for example, the flip-flop 14 receiving the output from the flip-flop 13 operates at a falling edge of the clock signal CLK (the above is similarly applied to each of the embodiments that are described later).

Next, an operation of the power gating circuit 10 in the first embodiment is explained.

Figure 4A:
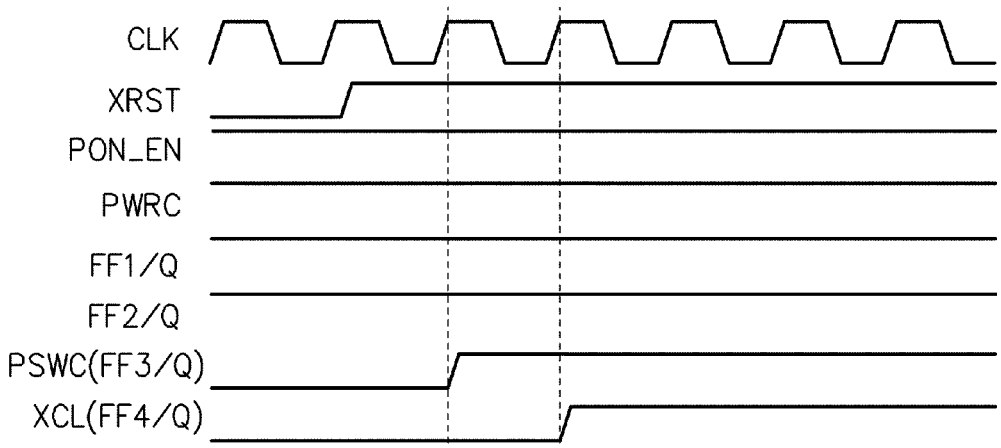
FIG. 4A is a view depicting one example of an operational waveform of the power gating circuit in the first embodiment.
Figure 4B:
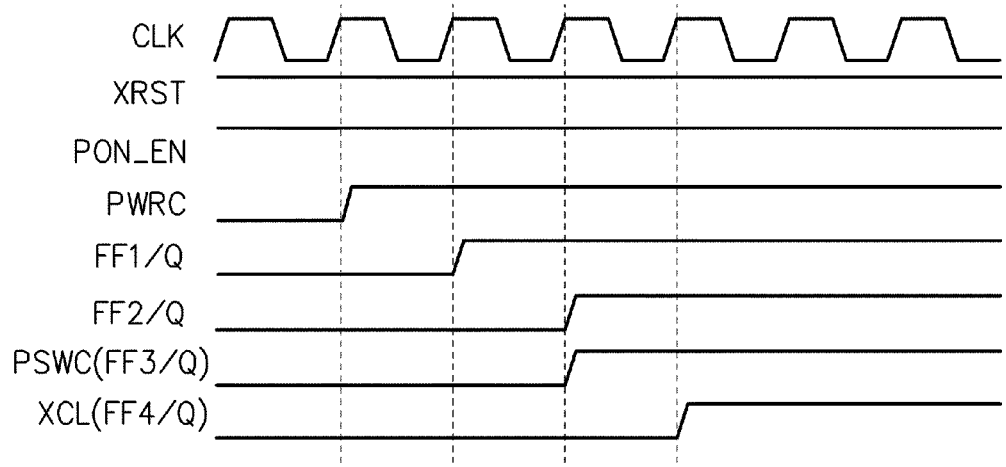
FIG. 4B is a view depicting one example of the operational waveform of the power gating circuit in the first embodiment.
Figure 4C:
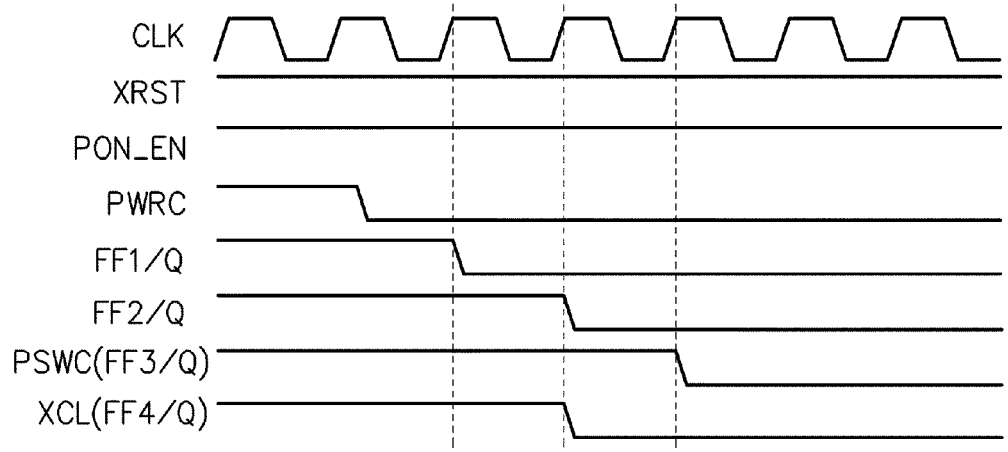
FIG. 4C is a view depicting one example of the operational waveform of the power gating circuit in the first embodiment.

FIG. 4A, FIG. 4B, and FIG. 4C are views depicting one example of operational waveforms of the power gating circuit 10 in the first embodiment. FIG. 4A depicts the operational waveform in the case when power is supplied to the power domain to be controlled by releasing a reset state. FIG. 4B depicts the operational waveform in the case when power is supplied to the power domain to be controlled by the power-on/off control signal PWRC. FIG. 4C depicts the operational waveform in the case when power of the power domain to be controlled is cut off by the power-on/off control signal PWRC.

In FIG. 4A, the outputs from the flip-flops 11, 12 (FF1/Q, FF2/Q) are at "H" when the reset signal XRST is at "L". Further, the control signal PSWC and the clamp signal XCL that are the outputs from the flip-flops 13, 14 (FF3/Q, FF4/Q) are at "L". At this time, both of the power supply enable signal PON_EN and the power-on/off control signal PWRC are set to be at "H". Accordingly, inputs to the flip-flops 11, 12, and 13 are at "H", and an input to the flip-flop 14 is at "L".

Then, after the reset signal XRST changes from "L" to "H", the output from the flip-flop 13 (FF3/Q), namely the control signal PSWC changes from "L" to "H" at the rising edge of the clock signal CLK after the change. Thereby, the power switch to supply power to the power domain to be controlled turns to the on state, and the power supply is started.

Further, the output from the flip-flop 13 (FF3/Q) changes to "H", and thereby, the output from the AND circuit 17 to be input to the flip-flop 14 changes from "L" to "H". The output from the flip-flop 14 (FF4/Q), namely the clamp signal XCL and the valid signal PWRV change from "L" to "H" at the rising edge of the clock signal CLK after the change. Thereby, clamping (masking) an output signal from the power domain to be controlled is released.

Further, the power-on/off control signal PWRC changes from "L" to "H" in the case when power is supplied to the power domain to be controlled by the power-on/off control signal PWRC as depicted in FIG. 4B. With this, the output from the flip-flop 11 (FF1/Q) changes to "H" at the rising edge of the clock signal CLK after the change. Thereby, the output from the flip-flop 13 (FF3/Q), namely the control signal PSWC changes from "L" to "H" at the rising edge of the subsequent clock signal CLK, and the power supply to the power domain to be controlled is started.

The output from the flip-flop 13 (FF3/Q) changes to "H", and thereby, the output from the AND circuit 17 to be input to the flip-flop 14 changes from "L" to "H". Accordingly, the output from the flip-flop 14 (FF4/Q), namely the clamp signal XCL and the valid signal PWRV change from "L" to "H" at the rising edge of the clock signal CLK after the change, and clamping (masking) the output signal from the power domain to be controlled is released.

According to this manner, the power gating circuit 10 in the first embodiment first asserts the control signal PSWC of the power switch, and then negates the clamp signals CL, XCL in the case when the power supply to the power domain to be controlled is started. Concretely, the power gating circuit 10 has the output from the flip-flop 13 output as the control signal PSWC accessed to the flip-flop 14, and then generates the clamp signals CL, XCL and the valid signal PWRV. Thereby, after the power supply to the power domain to be controlled is started, a supply voltage stabilizes, and then clamping the output signal from the power domain to be controlled is released. Accordingly, it is possible to prevent the indefinite value signal from being input to circuits in other power domains receiving the output signal from the power domain to be controlled securely, and to prevent the circuit from operating erroneously, and to prevent the unintended short-circuit current from flowing.

Further, in the power gating circuit 10 in the first embodiment, there is provided a path where the power-on/off control signal PWRC input via the flip-flop 11 is propagated to the flip-flop 13 without via the flip-flop 12. Thereby, in the case when the power-on/off control signal PWRC changes from "L" to "H", the control signal PSWC may be changed from "L" to "H" speedily.

Further, the power-on/off control signal PWRC changes from "H" to "L" in the case when power of the power domain to be controlled is cut off by the power-on/off control signal PWRC as depicted in FIG. 4C. With this, the output from the flip-flop 11 (FF1/Q) changes to "L" at the rising edge of the clock signal CLK after the change. That is, the inputs to the flip-flops 12, 14 change from "H" to "L".

Accordingly, the clamp signal XCL and the valid signal PWRV that are the output from the flip-flop 12 (FF2/Q) and the output from the flip-flop 14 (FF4/Q) change from "H" to "L" at the rising edge of the subsequent clock signal CLK. Therefore, the output signal from the power domain to be controlled is clamped (masked).

Further, the output from the flip-flop 12 (FF2/Q) changes to "L", and thereby, the input to the flip-flop 13 changes from "H" to "L". Then, the control signal PSWC being the output from the flip-flop 13 (FF3/Q) changes from "H" to "L" at the rising edge of the clock signal CLK after the change, and power of the power domain to be controlled is cut off.

According to this manner, the power gating circuit 10 in the first embodiment asserts the clamp signals CL, XCL, and then negates the control signal PSWC of the power switch in the case when power to the power domain to be controlled is cut off. Thereby, power is cut off after the output signal from the power domain to be controlled is clamped (masked), resulting that the indefinite value signal may be securely prevented from being input to the circuits of other power domains receiving the output signal from the power domain to be controlled.

Further, in the power gating circuit 10 in the first embodiment, the circuit configuration in which the power-on/off control signal PWRC does not function is applied in the case when the power supply enable signal PON_EN is at "L", namely the power supply to the power domain to be controlled is not allowed. That is, in the case when the power supply enable signal PON_EN is at "L", even though the power-on/off control signal PWRC is made to change from "L" to "H" in order to turn power of the power domain to be controlled on, the change is masked by the AND circuit 16.

Thereby, in the case when the power supply enable signal PON_EN is at "L", the control signal PSWC of the power switch is not asserted, and the power supply to the power domain to be controlled may be suppressed. Consequently, in the case when the power supply to the power domain to be controlled is prohibited, the power supply enable signal PON_EN is kept at "L", and thereby, the power supply to the power domain to be controlled may be prevented securely.

Note that the flip-flops 11, 12 are preset to the initial value "1" by the reset signal XRST in the example depicted in FIG. 3. However, it is also possible to reset the flip-flops 11, 12 to the initial value "0", and to control not to supply power to the power domain to be controlled at the time of reset release depending on product specification (the above is similarly applied to each of the embodiments that are described later).

Figure 5:
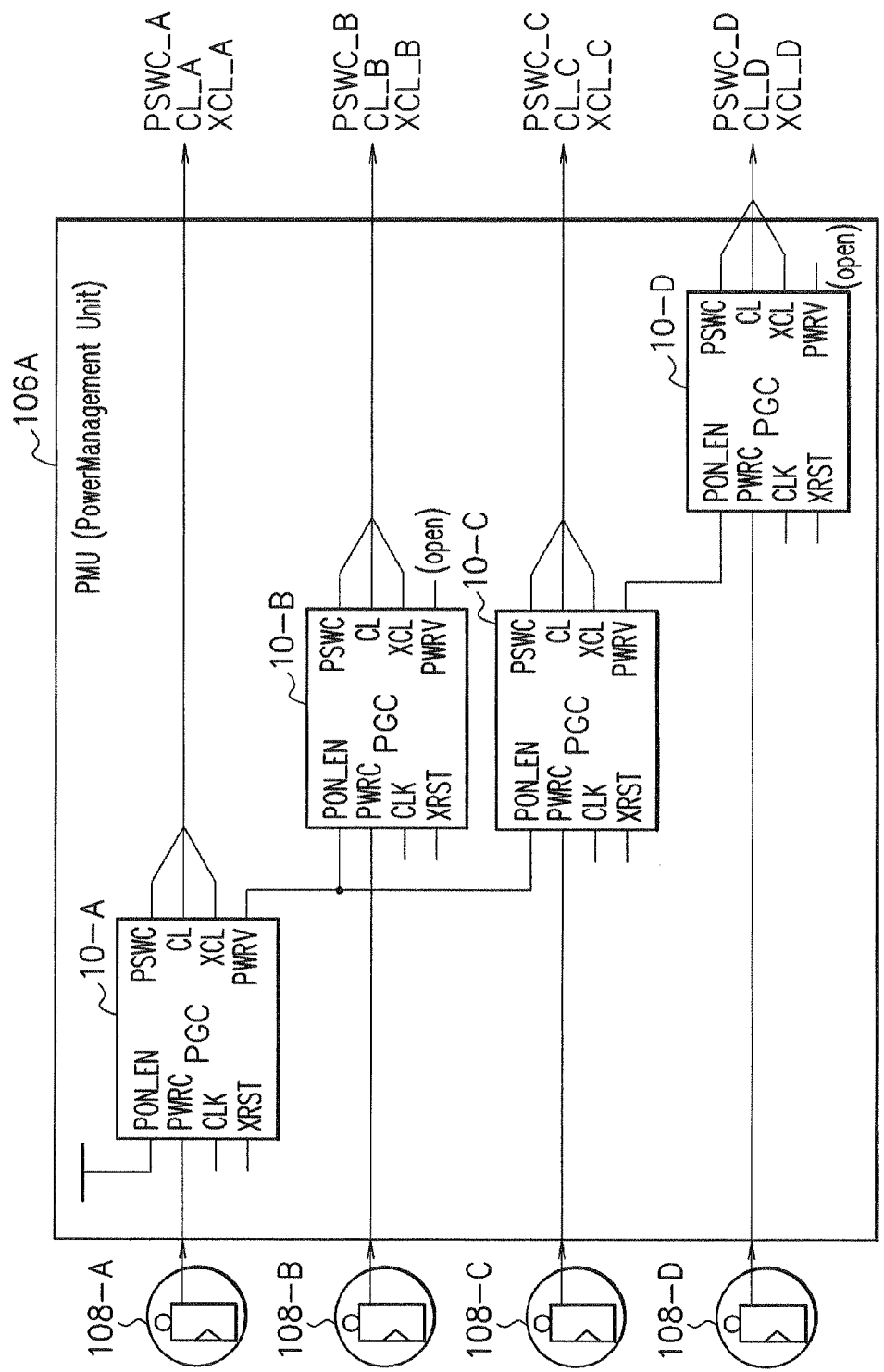
FIG. 5 is a view depicting a configuration example of a power management unit in the first embodiment.

FIG. 5 is a view depicting a configuration example of a power management unit 106A in the first embodiment. FIG. 5 depicts the power management unit 106A corresponding to the semiconductor device 101 depicted in FIG. 1 as one example.

The power management unit 106A includes power gating circuits 10-A, 10-B, 10-C, and 10-D configured as depicted in FIG. 3. The power gating circuit 10-A corresponds to the power domain A 102, and the power gating circuit 10-B corresponds to the power domain B 103. Similarly, the power gating circuits 10-C, 10-D correspond to the power domain C 104, the power domain D 105 respectively. That is, the power management unit 106A is configured to assign the single power gating circuit 10 to each of the power domain A 102 to the power domain D 105.

An output from an on/off control circuit 108-A related to the power domain A is input to the power gating circuit 10-A as the power-on/off control signal PWRC. Further, an output from an on/off control circuit 108-B related to the power domain B is input to the power gating circuit 10-B as the power-on/off control signal PWRC. Similarly, outputs from on/off control circuits 108-C, 108-D related to the respective power domain C and power domain D are input to the power gating circuits 10-C, 10-D as the power-on/off control signal PWRC.

The on/off control circuits 108-A to 108-D related to the respective power domains are configured by, for example, a register and the like. Note that the on/off control circuits 108-A to 108-D are provided outside the power management unit 106A in FIG. 5, but the on/off control circuits 108-A to 108-D may be provided inside the power management unit 106A.

Further, as depicted in FIG. 5, the respective power gating circuits 10-A to 10-D are connected in accordance with the inclusion relation (dependency relation) of the power domains in the semiconductor device 101. That is, it is connected so that a valid signal PWRV_A output from the power gating circuit 10-A is input to the power gating circuits 10-B, 10-C corresponding to the power domain B, the power domain C included inside the power domain A as power supply enable signals PON_EN_B, PON_EN_C. Further, it is connected so that a valid signal PWRV_C output from the power gating circuit 10-C is input to the power gating circuit 10-D corresponding to the power domain D included inside the power domain C as a power supply enable signal PON_EN_D.

That is, the respective power gating circuits are connected so that the valid signal PWRV output from the power gating circuit corresponding to the power domain on the including side is input to the power gating circuit corresponding to the power domain on the included side as the power supply enable signal PON_EN.

Note that a power supply enable signal PON_EN input to the power gating circuit 10-A corresponding to the power domain A is only necessary to be clipped at "H" (the power supply is only necessary to be allowed at the time of reset release). Further, valid signal PWRV outputs from the power gating circuits 10-B, 10-D corresponding to the power domain B, the power domain D that do not include other power domains inside are not used, and therefore, the valid signal PWRV outputs are only necessary to be non-connected (open).

The power management unit 106A is configured by connecting the respective power gating circuits 10-A to 10-D as depicted in FIG. 5, and thereby, the power supply to the power domain on the included side may be performed after the power supply to the power domain on the including side is performed. Consequently, in accordance with the inclusion relation of the power domains inside the semiconductor device, the power supply to the power domain may be performed in sequence, and the power management unit depending on the power control specification may be designed easily.

Figure 6A:
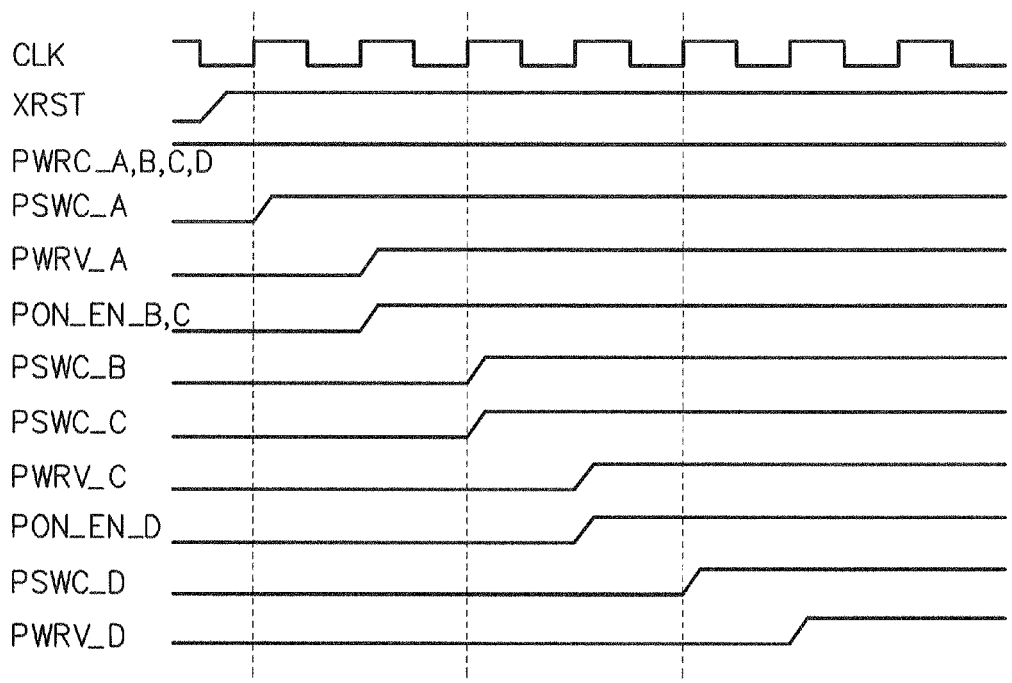
FIG. 6A is a view depicting one example of an operational waveform of the power management unit in the first embodiment.

For example, at the time of reset release as depicted in FIG. 6A, the control signal PSWC_A of the power switch from the power domain A is first asserted. Thereafter, the valid signal PWRV_A from the power domain A, namely the power supply enable signals PON_EN_B, PON_EN_C to the power domain B, the power domain C are asserted, and then, the control signals PSWC_B, PSWC_C of the power switch from the power domain B, the power domain C are asserted. Subsequently, the valid signal PWRV_C from the power domain C, namely the power supply enable signal PON_EN_D to the power domain D is asserted, and then, the control signal PSWC_D of the power switch from the power domain D is asserted.

Figure 6B:
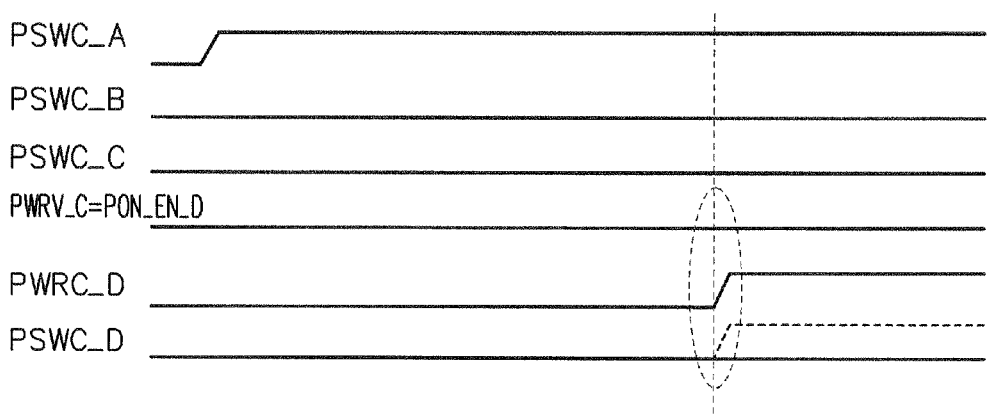
FIG. 6B is a view depicting one example of the operational waveform of the power management unit in the first embodiment.

Further, in the case when power is on in the power domain A, but power is off in the power domain B, the power domain C, and the power domain D as depicted FIG. 6B, a power-on/off control signal PWRC_D to the power domain D is set to be asserted erroneously. In this case, the valid signal PWRV_C from the power domain C, namely the power supply enable signal PON_EN_D to the power domain D is negated since power is off in the power domain C. Consequently, the power supply to the power domain D may be prevented, and erroneous power control may be prevented securely even though the power-on/off control signal PWRC_D to the power domain D is asserted erroneously.

Second Embodiment

Next, a second embodiment is explained.

Figure 7:
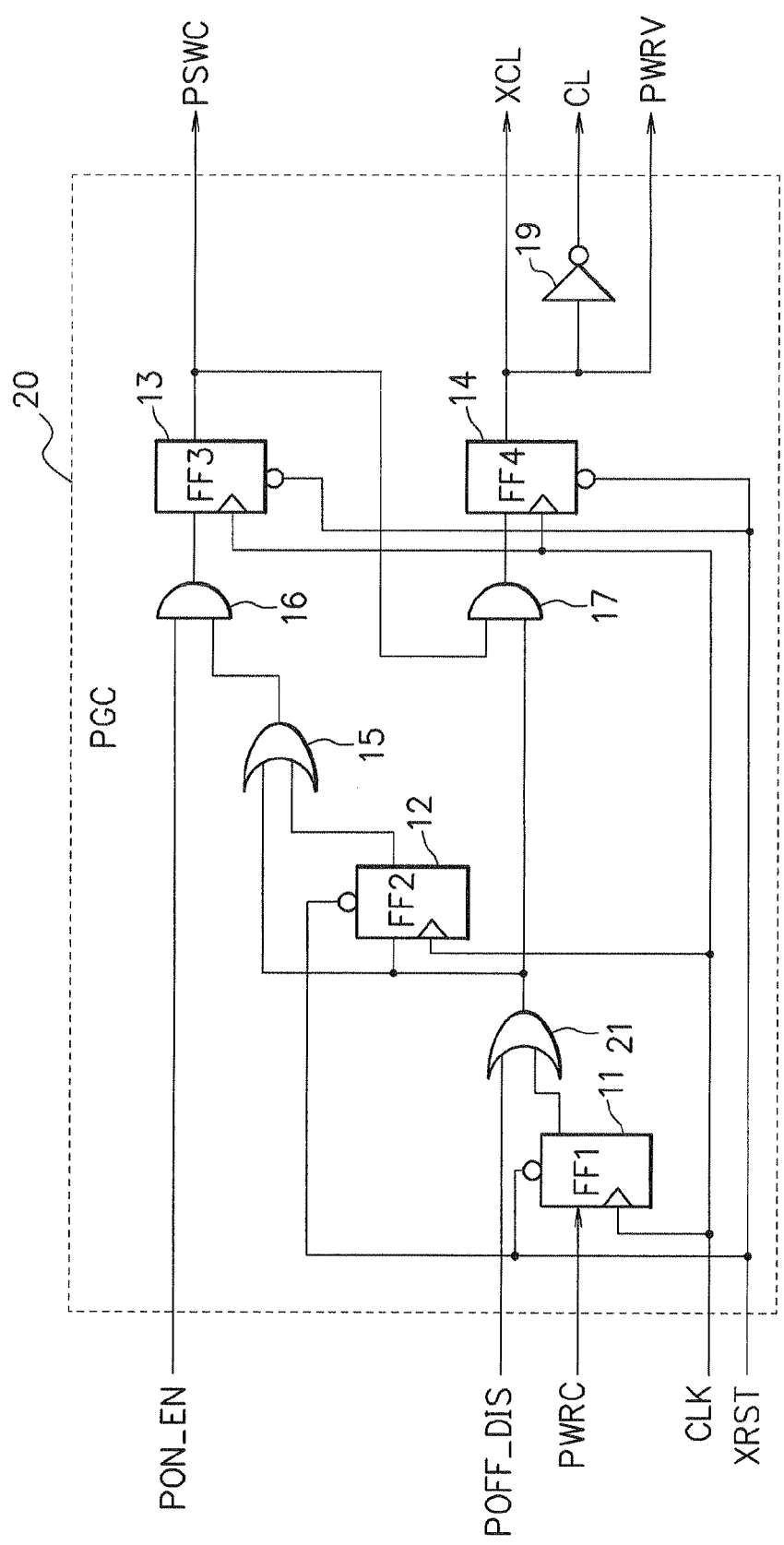
FIG. 7 is a circuit diagram depicting a configuration example of a power gating circuit in a second embodiment.

FIG. 7 is a circuit diagram depicting a configuration example of a power gating circuit (PGC) in the second embodiment. In FIG. 7, the same reference numerals and symbols are given to components the same as the components depicted in FIG. 3, and redundant explanation thereof is omitted.

A power gating circuit 20 includes an OR circuit 21 in addition to the flip-flops 11, 12, 13, and 14, the OR circuit 15, the AND circuits 16, 17, and the inverter 19 as depicted in FIG. 7. Further, a power cut-off disable signal POFF_DIS is input to the power gating circuit 20 in addition to the clock signal CLK, the reset signal XRST, the power-on/off control signal PWRC, and the power supply enable signal PON_EN.

The power gating circuit 20 has the power-on/off control signal PWRC and the power cut-off disable signal POFF_DIS operated in the OR circuit 21, and has an operation result thereof input to the flip-flop 12, the OR circuit 15, and the AND circuit 17, and the above point is different from the first embodiment. The power cut-off disable signal POFF_DIS is to indicate whether or not a power cut-off of the corresponding power domain is prohibited. The power cut-off disable signal POFF_DIS is at "H" in the case when the power cut-off is prohibited, and the power cut-off disable signal POFF_DIS is at "L" in the case when the power cut-off is not prohibited.

In brief, in the power gating circuit 20 in the second embodiment, the circuit configuration in which the power-on/off control signal PWRC does not function is applied in the case when the power cut-off disable signal POFF_DIS is at "H", namely the power cut-off of the power domain to be controlled is prohibited. In the case when power of the power domain to be controlled is in the on state and the power cut-off disable signal POFF_DIS is at "H", even though the power-on/off control signal PWRC is made to change from "H" to "L" in order to cut off power, the change is masked by the OR circuit 21.

Thereby, in the case when the power cut-off disable signal POFF_DIS is at "H", the control signal PSWC of the power switch is not negated by the power-on/off control signal PWRC, and it is possible to suppress power of the power domain to be controlled being cut off. Consequently, in the case when cutting off power of the power domain to be controlled is prohibited, the power cut-off disable signal POFF_DIS is kept at "H", and thereby it is possible to prevent power from being cut off by the control signal PSWC of the power switch securely.

Figure 8A:
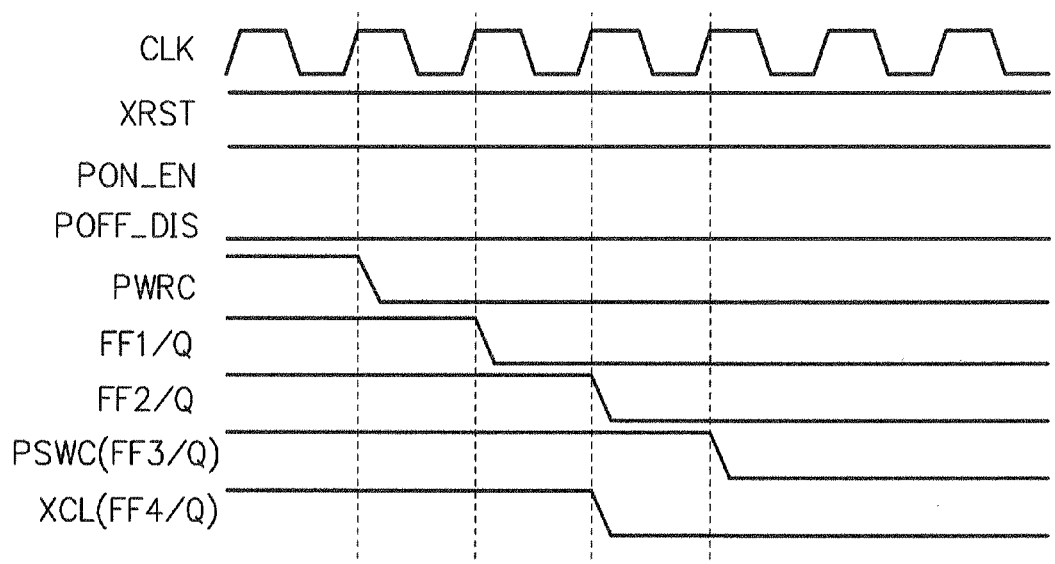
FIG. 8A is a view depicting one example of an operational waveform of the power gating circuit in the second embodiment.
Figure 8B:
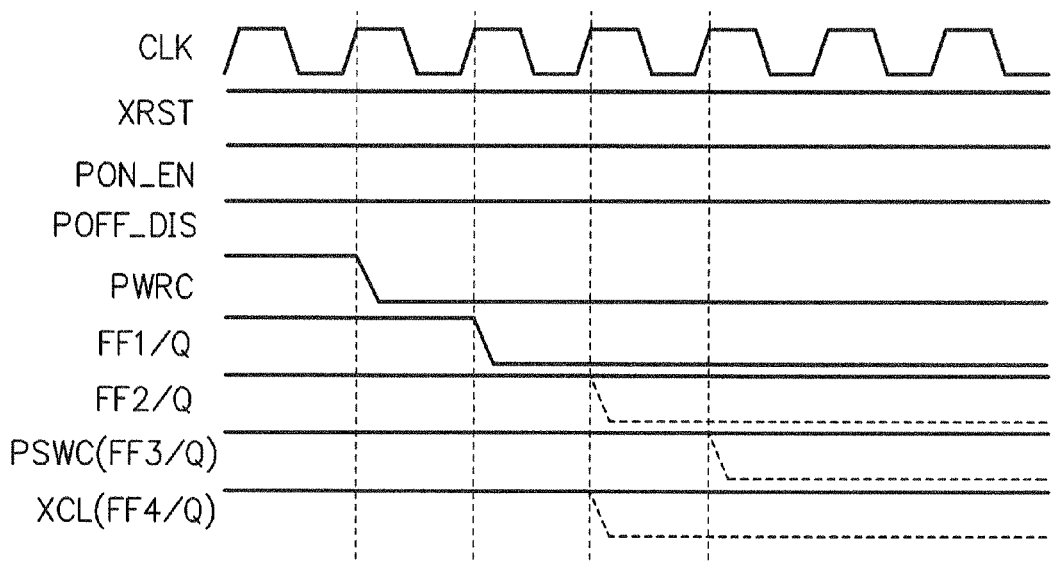
FIG. 8B is a view depicting one example of the operational waveform of the power gating circuit in the second embodiment.

FIG. 8A and FIG. 8B are views depicting one example of operational waveforms of the power gating circuit 20 in the second embodiment. FIG. 8A depicts the operational waveform in the case when the power cut-off disable signal POFF_DIS is at "L". FIG. 8B depicts the operational waveform in the case when the power cut-off disable signal POFF_DIS is at "H".

In the case when the power cut-off disable signal POFF_DIS is at "L" as depicted in FIG. 8A, the power-on/off control signal PWRC changes from "H" to "L", and the power gating circuit 20 in the second embodiment operates similarly to the power gating circuit 10 in the first embodiment depicted in FIG. 4C. That is, the clamp signal XCL and the valid signal PWRV being the output from the flip-flop 14 (FF4/Q) change from "H" to "L", and the output signal from the power domain to be controlled is clamped (masked). Thereafter, the control signal PSWC being the output from the flip-flop 13 (FF3/Q) changes from "H" to "L", and power of the power domain to be controlled is cut off.

By contrast, in the case when the power cut-off disable signal POFF_DIS is at "H" as depicted in FIG. 8B, the power-on/off control signal PWRC changes to "L", and then the output from the flip-flop 11 (FF1/Q) changes to "L" at the rising edge of the clock signal CLK after the change. However, since the power cut-off disable signal POFF_DIS is at "H", the output from the OR circuit 21 does not change and the inputs to the flip-flops 12 to 14 do not change either. Consequently, the control signal PSWC being the output from the flip-flop 13 (FF3/Q) and the clamp signal XCL and the valid signal PWRV being the output from the flip-flop 14 (FF4/Q) do not change, resulting that power of the power domain to be controlled is not cut off.

Note that an operation in the case when power is supplied to the power domain to be controlled by reset release and the power-on/off control signal PWRC is similar to that of the first embodiment.

Figure 9:
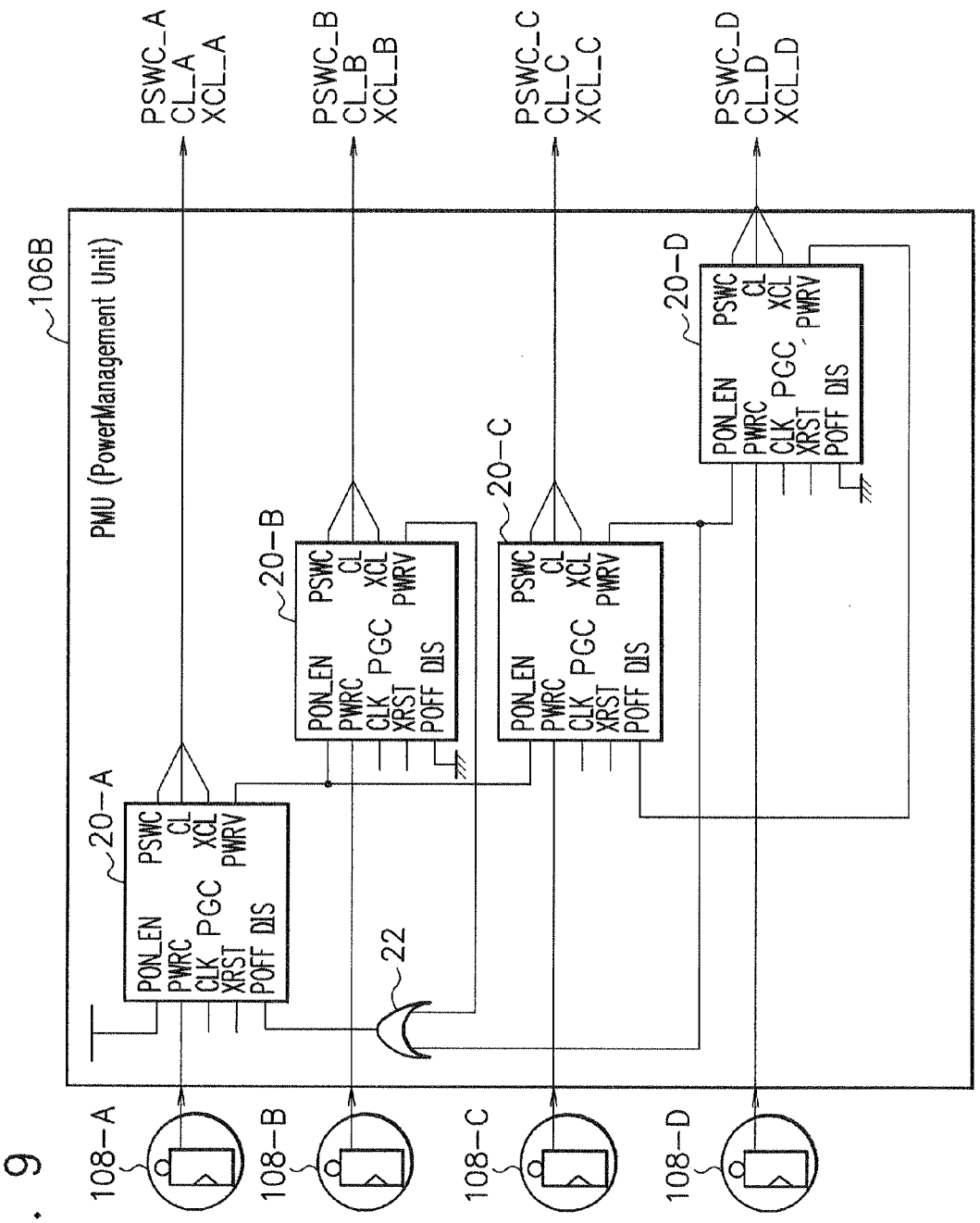
FIG. 9 is a view depicting a configuration example of a power management unit in the second embodiment.

FIG. 9 is a view depicting a configuration example of a power management unit 106B in the second embodiment. FIG. 9 depicts the power management unit 106B corresponding to the semiconductor device 101 depicted in FIG. 1 as one example. Further, in FIG. 9, the same reference numerals and symbols are given to components the same as the components depicted in FIG. 5, and redundant explanation thereof is omitted.

The power management unit 106B is configured to assign the single power gating circuit 20 to the power domain A 102 to the power domain D 105 each, and includes power gating circuits 20-A, 20-B, 20-C, and 20-D configured as depicted in FIG. 7. The power gating circuits 20-A to 20-D correspond to the power domain A 102 to the power domain D 105 respectively. The outputs from the on/off control circuits 108-A to 108-D related to the respective corresponding power domains are input to the power gating circuits 20-A to 20-D as the power-on/off control signal PWRC.

Further, similarly to the first embodiment, in the power management unit 106B, the valid signal PWRV outputs and the power supply enable signal PON_EN inputs in the power gating circuits 20-A to 20-D are connected in accordance with the inclusion relation (dependency relation) of the power domains in the semiconductor device 101.

Further, as depicted in FIG. 9, it is connected so that the valid signal PWRV output from the power gating circuit corresponding to the power domain on the included side is input to the power gating circuit corresponding to the power domain on the including side as the power cut-off disable signal POFF_DIS. At this time, in the case when there are the plurality of power domains included in the power domain, OR logic of the valid signals PWRV related to the respective included power domains is applied to be input to the power gating circuit of the including power domain as the power cut-off disable signal POFF_DIS.

That is, in the example depicted in FIG. 9, a valid signal PWRV_B and the valid signal PWRV_C output from the power gating circuits 20-B, 20-C corresponding to the power domain B, the power domain C are input to an OR circuit 22. Then, an output from the OR circuit 22 is input to the power gating circuit 20-A corresponding to the power domain A that includes the power domain B, the power domain C as a power cut-off disable signal POFF_DIS_A. Further, it is connected so that a valid signal PWRV_D output from the power gating circuit 20-D is input to the power gating circuit 20-C corresponding to the power domain C that includes the power domain D as a power cut-off disable signal POFF_DIS_C.

The power management unit 106B is configured by connecting the respective power gating circuits 20-A to 20-D as depicted in FIG. 9, and thereby, the power supply to the power domain on the included side may be performed after the power supply to the power domain on the including side is performed. Therefore, the power supply to the power domain may be performed in sequence in accordance with the inclusion relation of the power domains inside the semiconductor device. Further, it is possible to suppress power of the power domain on the including side being cut off while the power supply to the power domain on the included side is being performed, and the power cut-off of the power domain may be controlled appropriately in accordance with the inclusion relation of the power domains inside the semiconductor device. Consequently, the power management unit depending on the power control specification may be designed easily only by connecting the power gating circuits 20-A to 20-D assigned to each of the power domains inside the semiconductor device in accordance with the inclusion relation of the power domains.

Figure 10A:
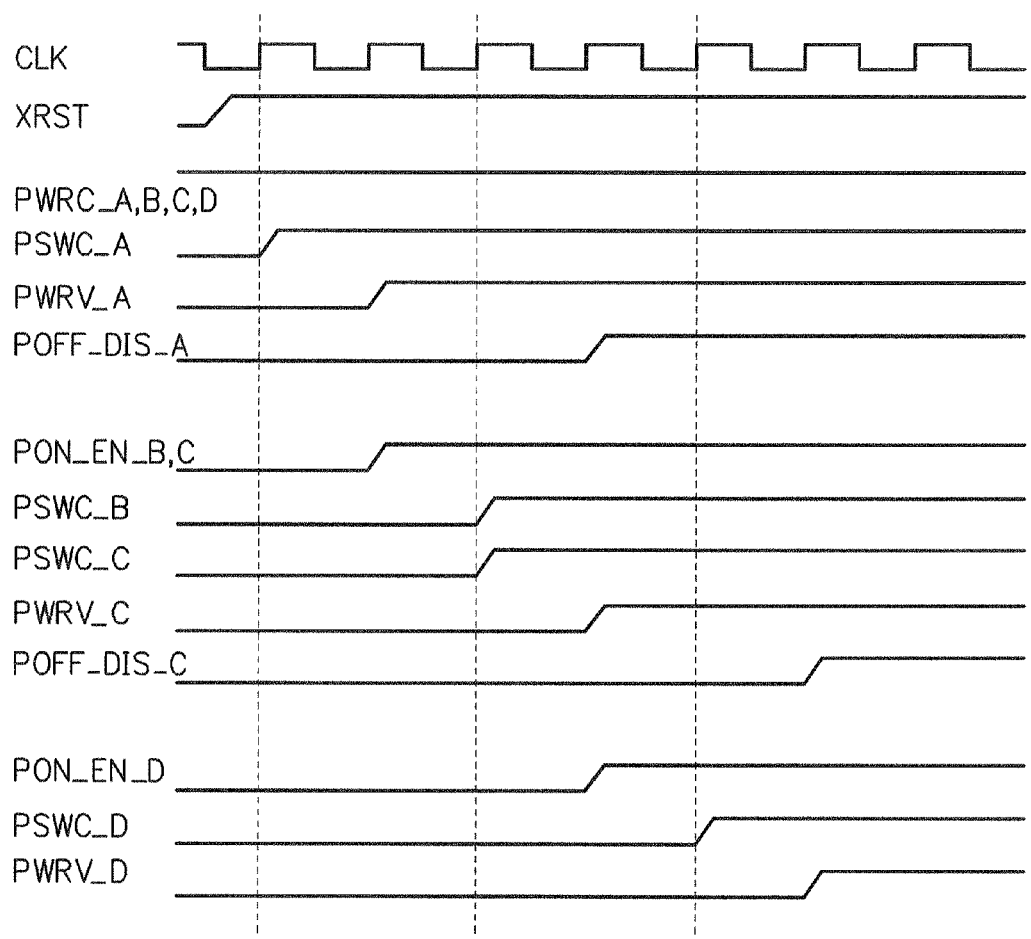
FIG. 10A is a view depicting one example of an operational waveform of the power management unit in the second embodiment.
Figure 10B:
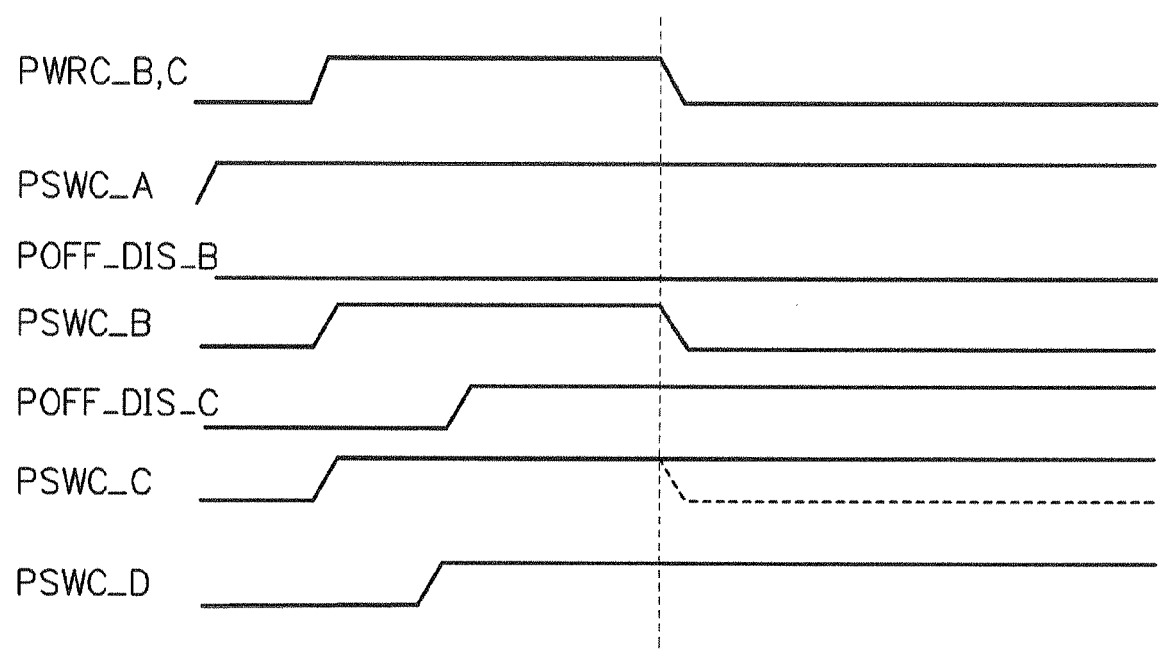
FIG. 10B is a view depicting one example of the operational waveform of the power management unit in the second embodiment.

FIG. 10A and FIG. 10B are views depicting one example of operational waveforms of the power management unit 106B in the second embodiment.

FIG. 10A depicts the operational waveform at the time of reset release. When the reset signal XRST is negated (reset-released), the control signal PSWC_A of the power switch from the power domain A is first asserted. Thereafter, the valid signal PWRV_A from the power domain A, namely the power supply enable signals PON_EN_B, PON_EN_C to the power domain B, the power domain C are asserted. Thereby, the control signals PSWC_B, PSWC_C of the power switch from the power domain B, the power domain C are asserted.

Subsequently, the valid signal PWRV_C from the power domain C, namely the power supply enable signal PON_EN_D to the power domain D is asserted. Further, the valid signals PWRV_B, PWRV_C from the power domain B, the power domain C are asserted, resulting that the power cut-off disable signal POFF_DIS_A to the power domain A is asserted.

Then, the control signal PSWC_D of the power switch from the power domain D is asserted after the power supply enable signal PON_EN_D to the power domain D is asserted. Subsequently, the valid signal PWRV_D from the power domain D, namely the power cut-off disable signal POFF_DIS_C to the power domain C is asserted.

Further, power-on/off control signals PWRC_B, PWRC_C to the power domain B, the power domain C are set to be negated erroneously in the case when power is on in the power domain A to the power domain D as depicted in FIG. 10B. In this case, the valid signal PWRV_D from the power domain D, namely the power cut-off disable signal POFF_DIS_C to the power domain C is asserted. Accordingly, the power cut-off of the power domain C may be suppressed, and the erroneous power control may be prevented securely even though the power-on/off control signal PWRC_C to the power domain C is negated erroneously.

Third Embodiment

Next, a third embodiment is explained.

Figure 11:
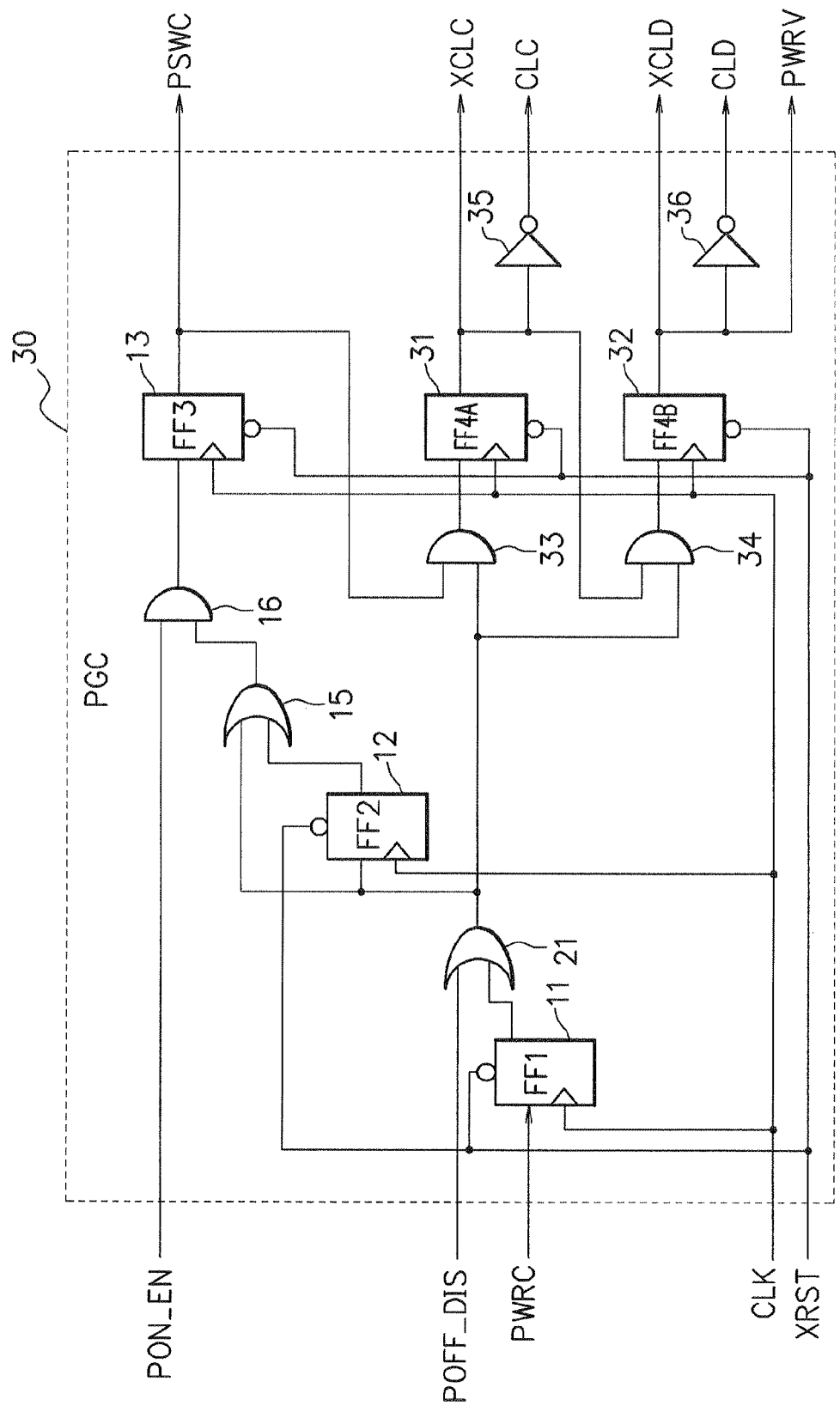
FIG. 11 is a circuit diagram depicting a configuration example of a power gating circuit in a third embodiment.

FIG. 11 is a circuit diagram depicting a configuration example of a power gating circuit (PGC) in the third embodiment. In FIG. 11, the same reference numerals and symbols are given to components the same as the components depicted in FIG. 7, and redundant explanation thereof is omitted.

As depicted in FIG. 11, a power gating circuit 30 includes flip-flops 11, 12, 13, 31, and 32, the OR circuits 15, 21, AND circuits 16, 33, and 34, and inverters 35, 36. Further, the clock signal CLK, the reset signal XRST, the power-on/off control signal PWRC, the power supply enable signal PON_EN, and the power cut-off disable signal POFF_DIS are input to the power gating circuit 30.

The output from the OR circuit 21 and the output from the flip-flop 13 are input to the AND circuit 33, and an operation result thereof is output to the flip-flop 31. An output from the flip-flop 31 is output as a negative clamp signal for clock XCLC, and is output via the inverter 35 as a positive clamp signal for clock CLC.

Further, the output from the OR circuit 21 and the output from the flip-flop 31 are input to the AND circuit 34, and an operation result thereof is output to the flip-flop 32. An output from the flip-flop 32 is output as a negative clamp signal for data XCLD and the valid signal PWRV, and is output via the inverter 36 as a positive clamp signal for data CLD.

In this manner, the clamp signals for clock CLC, XCLC and the clamp signals for data CLD, XCLD are provided in the power gating circuit 30 in the third embodiment. This is in order that, in the case when a synchronous reset circuit exists inside the power domain to be controlled, an operation after the power supply may be started after the synchronous reset circuit is initialized securely when power of the power domain turns to the on state from the off state. That is, there is a possibility that the register that is not initialized exists, and it is possible that an erroneous operation occurs in a subsequent operation if reset release is performed and supply of the clock signal is started at the same time as the clamp signal being negated after power of the power domain turns to the on state.

In the power gating circuit 30 in the third embodiment in order to prevent the above securely, the clamp signals for data CLD, XCLD are negated after the clamp signals for clock CLC, XCLC are negated in the case when the power supply to the power domain to be controlled is started. That is, the clamp signal related to clock control is first released, and then the clamp signal related to a data signal including reset is released. Note that in the case when power of the power domain to be controlled is cut off, the clamp signals for clock CLC, XCLC and the clamp signals for data CLD, XCLD are asserted at the same timing.

In the example depicted in FIG. 11, the circuit configuration such that the valid signal PWRV changes at the same timing as the clamp signal for data XCLD is applied, but the valid signal PWRV may change at the same timing as the clamp signal for clock XCLC. Further, the signal made after the clamp signal for data XCLD is accessed to the flip-flop again may be output as the valid signal PWRV.

The power management unit in which the power gating circuit 30 in the third embodiment is employed is configured similarly by connecting the plurality of power gating circuits 30 similarly to the power management unit 106B in the second embodiment depicted in FIG. 9. Further, an operation thereof is similar to that of the second embodiment, so that explanation thereof is omitted.

Figure 12:
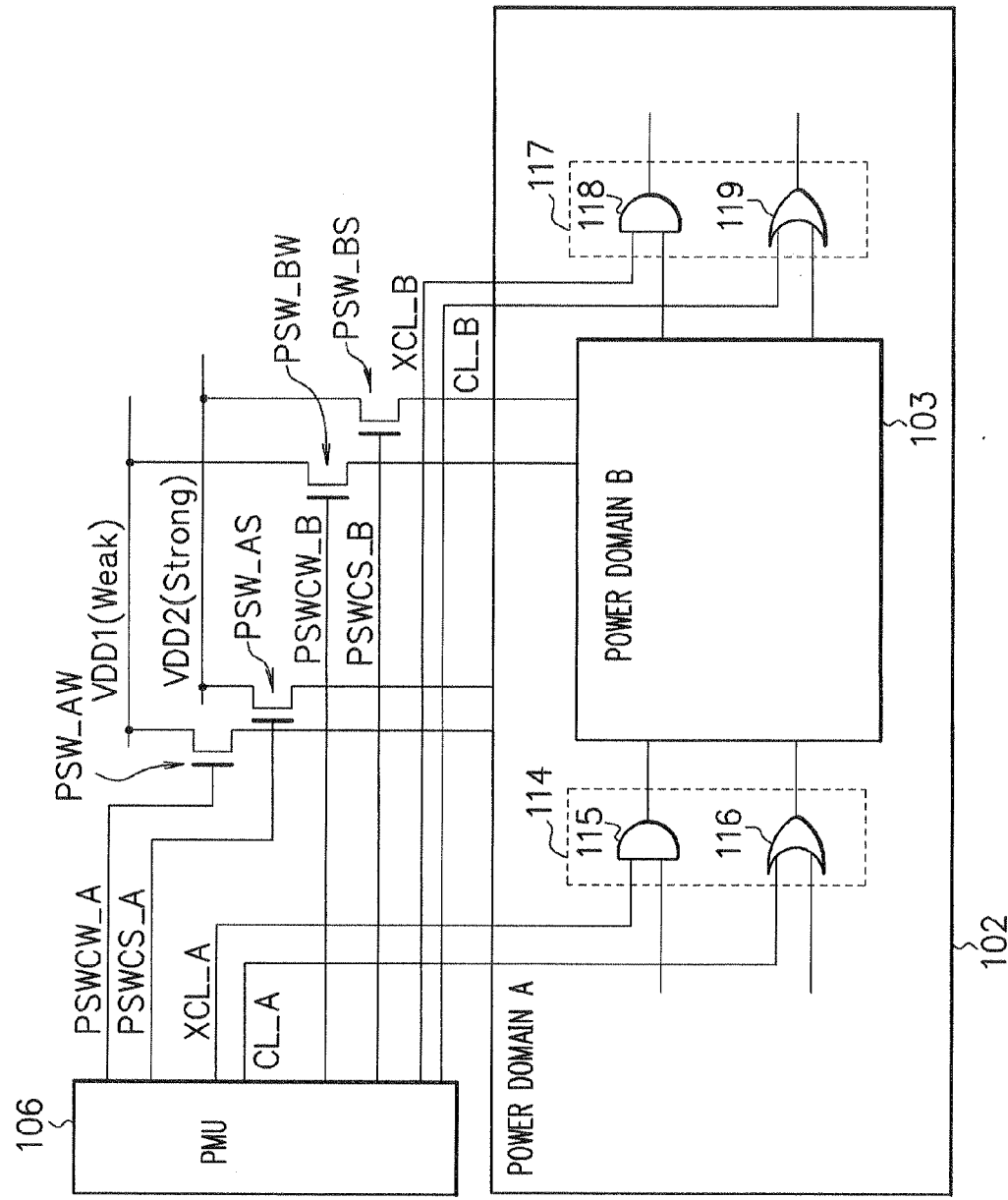
FIG. 12 is a view depicting another configuration example of the semiconductor device according to the present embodiments.

Fourth to sixth embodiments that are explained hereinafter correspond to a semiconductor device in which two types of power switches are provided as a power switch to supply power to the power domain as depicted in FIG. 12 in order to suppress noise due to an inrush current at the time of power supply.

FIG. 12 is a detailed explanatory view depicting the portion of the power domain B 103 focused with regard to signals input/output to/from the power domain A 102 and control signals from a power management unit 106. In FIG. 12, the same reference numerals and symbols are given to components the same as the components depicted in FIG. 2, and redundant explanation thereof is omitted. Incidentally, the entire configuration of a semiconductor device 101 is similar to the configuration depicted in FIG. 1 except that the point on which two types of the power switches are provided to the power domain A to the power domain D each is different.

The semiconductor device depicted in FIG. 12 includes power switches PSW_AW, PSW_BW of a first type, whose drive capability is low (weak) to each of the power domains, and power switches PSW_AS, PSW_BS of a second type, whose drive capability is high (strong) to each of the power domains. In the case when the power supply to the corresponding power domain is started, the power switches of the first type are first made to be in the on state to supply power thereto gradually, and then the power switches of the second type are made to be in the on state to supply power making a normal operation possible thereto. Consequently, an occurrence of power noise due to a large current (the inrush current) that flows momentarily at the time of power supply is suppressed, and causing an adverse effect on the circuits of other power domains operating already is prevented.

Fourth Embodiment

Next, the fourth embodiment is explained.

Figure 13:
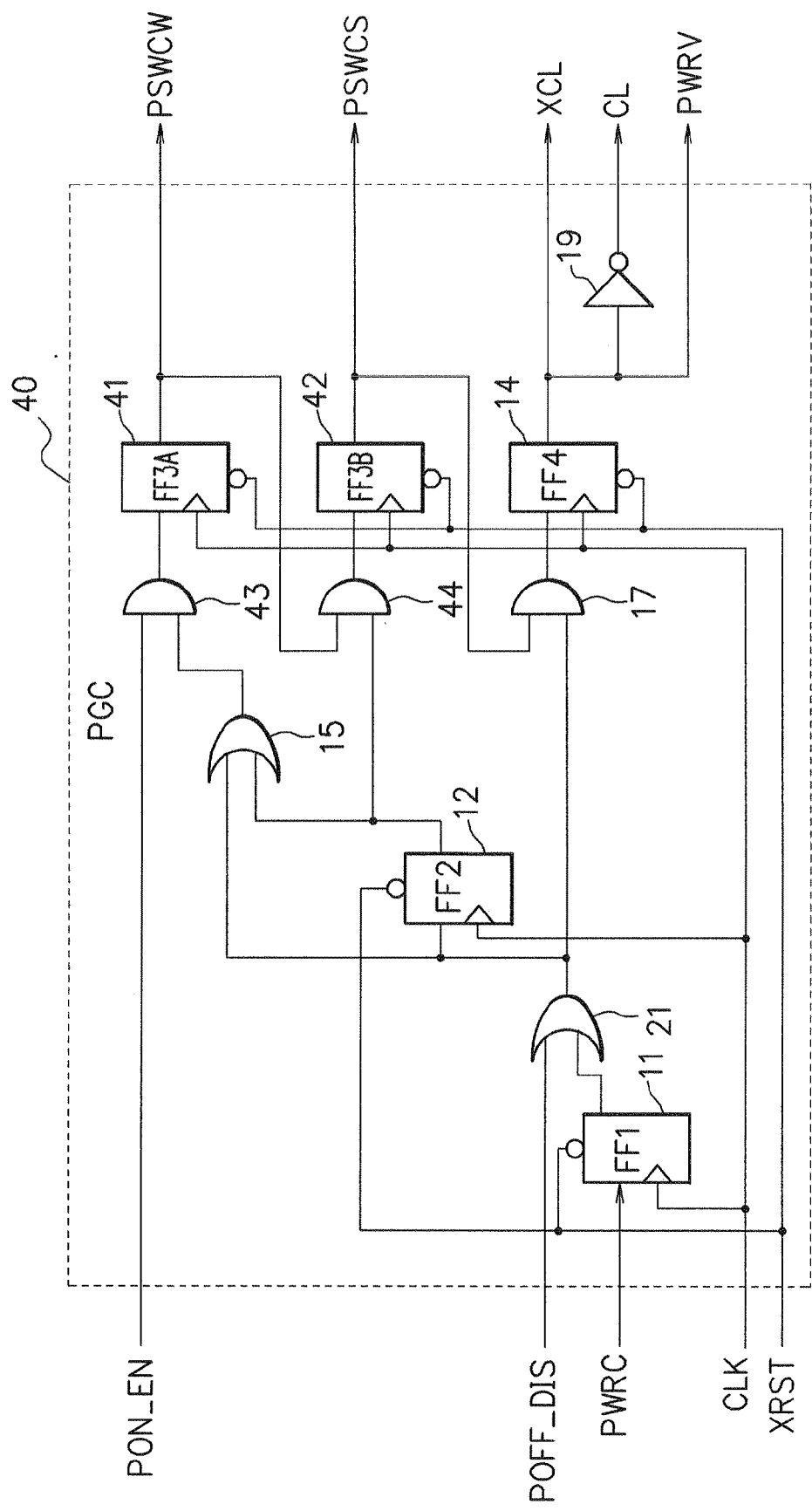
FIG. 13 is a circuit diagram depicting a configuration example of a power gating circuit in a fourth embodiment.

FIG. 13 is a circuit diagram depicting a configuration example of a power gating circuit (PGC) in the fourth embodiment. In FIG. 13, the same reference numerals and symbols are given to components the same as the components depicted in FIG. 7, and redundant explanation thereof is omitted.

As depicted in FIG. 13, a power gating circuit 40 includes flip-flops 11, 12, 14, 41, and 42, the OR circuits 15, 21, AND circuits 17, 43, and 44, and the inverter 19. Further, the clock signal CLK, the reset signal XRST, the power-on/off control signal PWRC, the power supply enable signal PON_EN, and the power cut-off disable signal POFF_DIS are input to the power gating circuit 40.

The output from the OR circuit 15 and the power supply enable signal PON_EN are input to the AND circuit 43, and an operation result thereof is output to the flip-flop 41. An output from the flip-flop 41 is output as a control signal PSWCW of the power switch of the first type whose drive capability is low (weak).

Further, the output from the flip-flop 12 and the output from the flip-flop 41 are input to the AND circuit 44, and an operation result thereof is output to the flip-flop 42. An output from the flip-flop 42 is output as a control signal PSWCS of the power switch of the second type whose drive capability is high (strong).

Further, the output from the OR circuit 21 and the output from the flip-flop 42 are input to the AND circuit 17.

In the power gating circuit 40 in the fourth embodiment depicted in FIG. 13, in the case when the power supply to the corresponding power domain is started, the control signal PSWCW of the power switch of the first type is first asserted, and then the control signal PSWCS of the power switch of the second type is asserted. Note that it is possible to adjust the duration from the time when the control signal PSWCW is asserted to the time when the control signal PSWCS is asserted by, for example, the cycle (frequency) of the clock signal CLK. Further, in the case when power of the corresponding power domain is cut off, the control signal PSWCW of the power switch of the first type and the control signal PSWCS of the power switch of the second type are negated simultaneously. An operation of the power gating circuit 40 in the fourth embodiment is similar to that of the second embodiment except that only the above-described control signals PSWCW and PSWCS corresponding to the control signal PSWC in the second embodiment are different.

Further, the power management unit in which the power gating circuit 40 in the fourth embodiment is employed is configured similarly by connecting the plurality of power gating circuits 40 similarly to the power management unit 106B in the second embodiment depicted in FIG. 9. Further, an operation of the power management unit is similar to that of the second embodiment, so that explanation thereof is omitted.

According to the fourth embodiment, the power management unit depending on the power control specification may be designed easily only by connecting the power gating circuits 40 assigned to each of the power domains inside the semiconductor device in accordance with the inclusion relation of the power domains similarly to that of the second embodiment.

Fifth Embodiment

Next, the fifth embodiment is explained.

Figure 14:
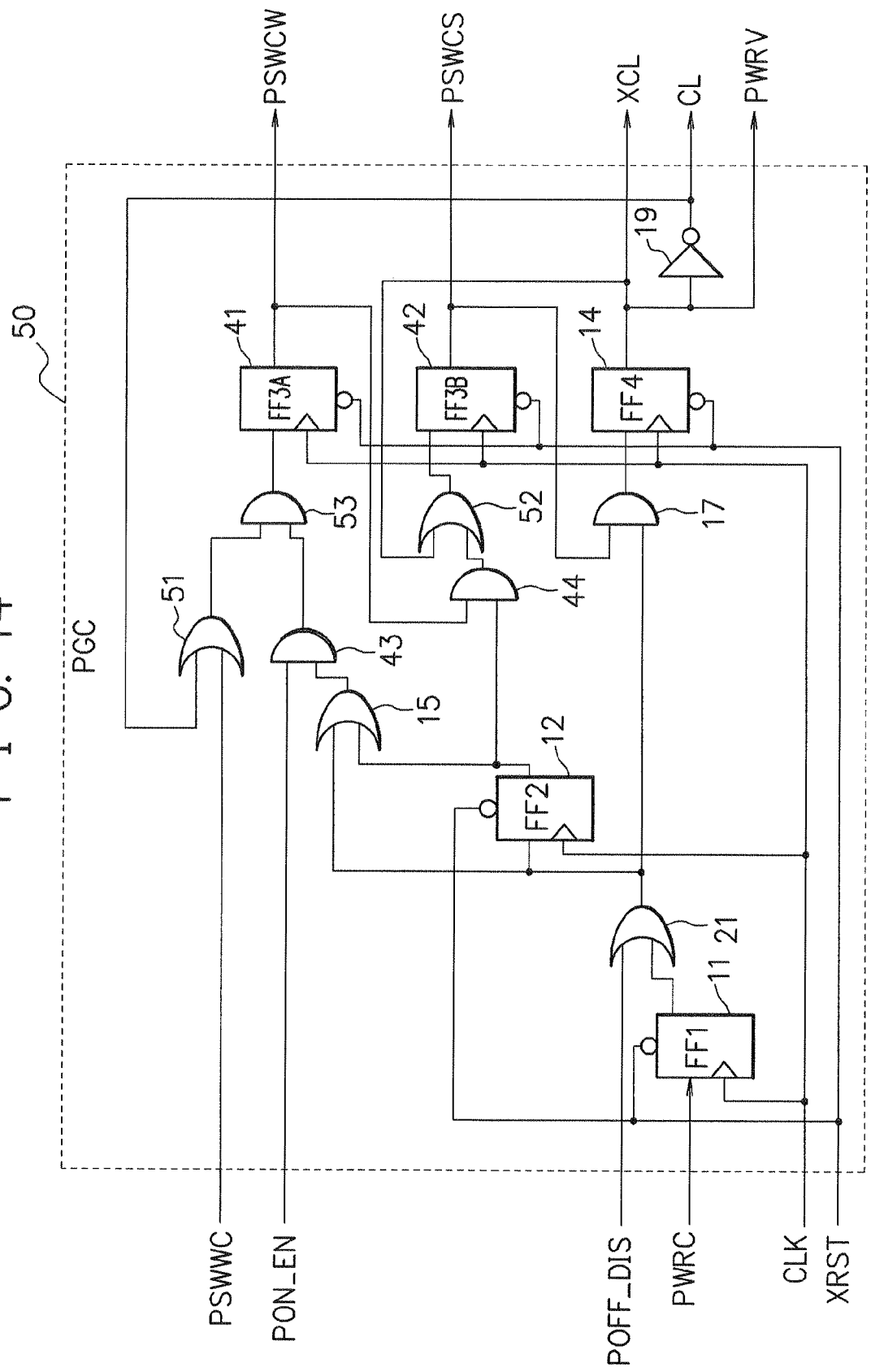
FIG. 14 is a circuit diagram depicting a configuration example of a power gating circuit in a fifth embodiment.

FIG. 14 is a circuit diagram depicting a configuration example of a power gating circuit (PGC) in the fifth embodiment. In FIG. 14, the same reference numerals and symbols are given to components the same as the components depicted in FIG. 13, and redundant explanation thereof is omitted.

As depicted in FIG. 14, a power gating circuit 50 includes the flip-flops 11, 12, 14, 41, and 42, OR circuits 15, 21, 51, and 52, AND circuits 17, 43, 44, and 53, and the inverter 19. Further, a control signal PSWWC is input to the power gating circuit 50 in addition to the clock signal OLE, the reset signal XRST, the power-on/off control signal PWRC, the power supply enable signal PON_EN, and the power cut-off disable signal POFF_DIS.

The OR circuit 51 has the control signal PSWWC and the output from the flip-flop 14 via the inverter 19 input thereto, and outputs an operation result thereof. The control signal PSWWC is to control whether or not to make the power switch of the first type whose drive capability is low (weak) in the off state after the power switch of the second type whose drive capability is high (strong) is made to be in the on state. The control signal PSWWC is at "L" in the case when the power switch of the first type is made to be in the off state after the power switch of the second type is made to be in the on state, and the control signal PSWWC is at "H" in the case when the power switch of the first type is kept in the on state. Note that the control signal PSWWC may be clipped at "H" or "L" outside the power gating circuit 50, or controlled by the register and the like.

An output from the AND circuit 43 and an output from the OR circuit 51 are input to the AND circuit 53, and an operation result thereof is output to the flip-flop 41. Further, an output from the AND circuit 44 and the output from the flip-flop 14 are input to the OR circuit 52, and an operation result thereof is output to the flip-flop 42.

In the power gating circuit 50 in the fifth embodiment depicted in FIG. 14, in the case when the power supply to the corresponding power domain is started, the control signal PSWCW of the power switch of the first type is first asserted, and then the control signal PSWCS of the power switch of the second type is asserted. Note that it is possible to adjust the duration from the time when the control signal PSWCW is asserted to the time when the control signal PSWCS is asserted by, for example, the cycle (frequency) of the clock signal CLK similarly to that of the fourth embodiment.

Further, in the power gating circuit 50, in the case when the control signal PSWWC is at "L", the power switch of the second type turns to the on state, and then, when the clamp signal CL is negated, an input to the flip-flop 41 turns to "L". Thereby, the control signal PSWCW of the power switch of the first type is negated and the power switch of the first type is made to be in the off state. Here, even though the control signal PSWCW changes, the change is masked by the OR circuit 52, as a result that the control signal PSWCS is not negated. Note that the output from the flip-flop 42 may be input to the OR circuits 51, 52 instead of the output from the flip-flop 14 in the case when the power switch of the first type is made to be in the off state immediately after the power switch of the second type turns to the on state.

By contrast, in the case when the control signal PSWWC is at "H", the power switch of the second type turns to the on state, and then even though the clamp signal CL is negated, it is masked by the OR circuit 51, and the input to the flip-flop 41 is kept at "H". Consequently, the control signal PSWCW of the power switch of the first type does not change, and the power switch of the first type is kept in the on state.

Further, in the power gating circuit 50 in the fifth embodiment, the control signal PSWCW of the power switch of the first type and the control signal PSWCS of the power switch of the second type are negated simultaneously in the case when power of the corresponding power domain is cut off.

Incidentally, the power management unit in which the power gating circuit 50 in the fifth embodiment is employed is configured similarly by connecting the plurality of power gating circuits 50 similarly to the power management unit 106B in the second embodiment depicted in FIG. 9. Further, an operation of the power management unit is similar to that of the second embodiment, so that explanation thereof is omitted.

According to the fifth embodiment, the power management unit depending on the power control specification may be designed easily only by connecting the power gating circuits 50 assigned to each of the power domains inside the semiconductor device in accordance with the inclusion relation of the power domains similarly to that of the second embodiment. Further, it is possible to control whether or not to make the power switch of the first type in the off state after the power switch of the second type is made to be in the on state. Accordingly, for example, in the case when a VDD1 power supply and a VDD2 power supply depicted in FIG. 12 are the different power supplies, the power switch of the first type is made to be in the off state after the power switch of the second type is made to be in the on state, and thereby, a connection with the VDD2 power supply can be cut off. Consequently, the power management unit is not influenced by power noise to be generated at the time of power supply to other power domains at all.

Sixth Embodiment

Next, the sixth embodiment is explained.

Figure 15:
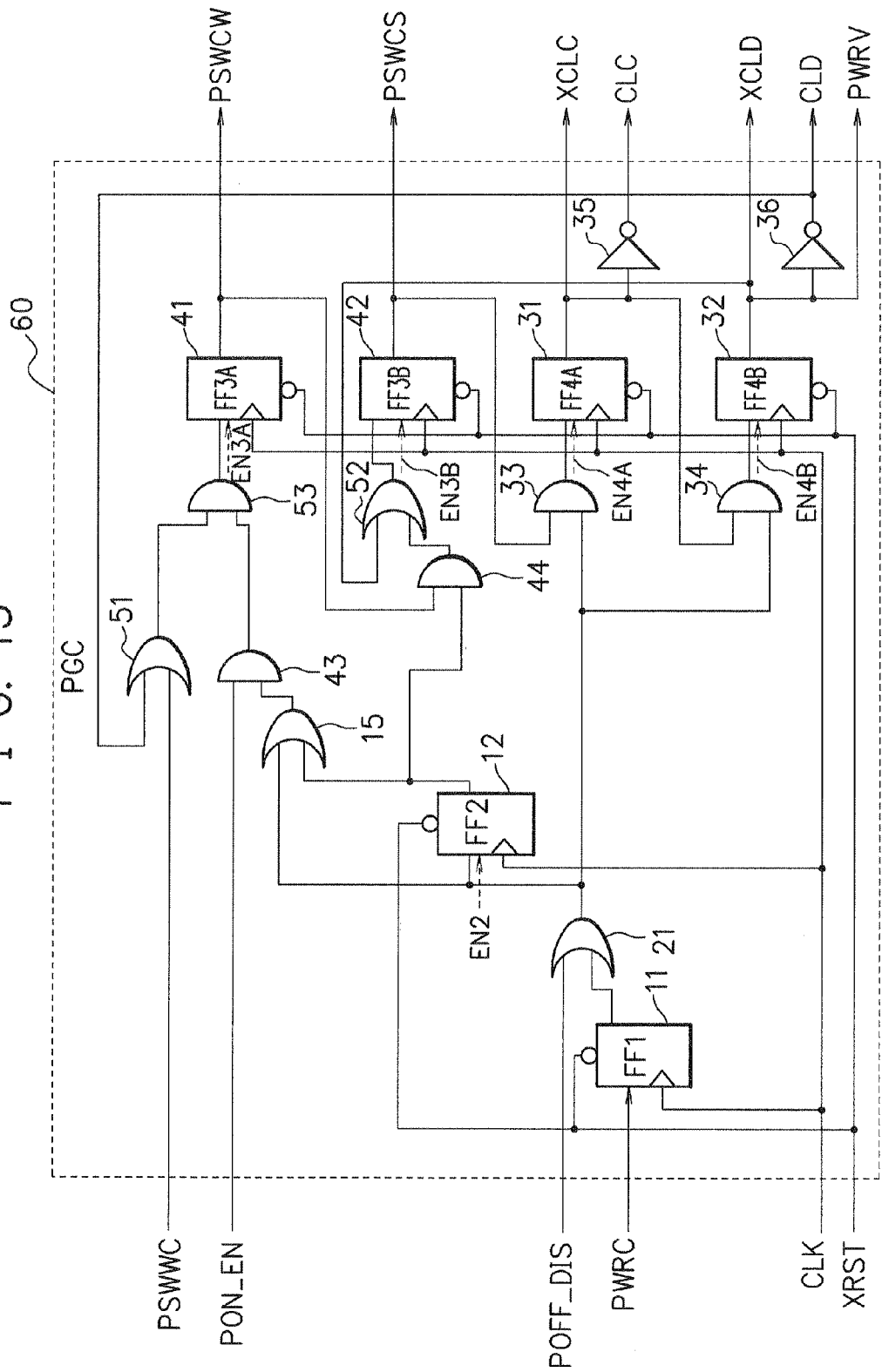
FIG. 15 is a circuit diagram depicting a configuration example of a power gating circuit in a sixth embodiment.

FIG. 15 is a circuit diagram depicting a configuration example of a power gating circuit (PGC) in the sixth embodiment. In FIG. 15, the same reference numerals and symbols are given to components the same as the components depicted in FIG. 11 and FIG. 14, and redundant explanation thereof is omitted.

A power gating circuit 60 in the sixth embodiment is made by integrating the configurations of the power gating circuits in the first embodiment to the fifth embodiment. Generation of each of the control signals PSWCW, PSWCS, the clamp signals CLC, XCLC, CLD, and XCLD, and the valid signal PWRV is similar to that of the above-described third embodiment and fifth embodiment. Further, the power management unit in which the power gating circuit 60 in the sixth embodiment is employed is configured similarly by connecting the plurality of power gating circuits 60 similarly to the power management unit 106B in the second embodiment depicted in FIG. 9, and an operation of the power management unit is also similar to that of the second embodiment.

According to the sixth embodiment, the power management unit depending on the power control specification may be designed easily only by connecting the power gating circuits 60 assigned to each of the power domains inside the semiconductor device in accordance with the inclusion relation of the power domains similarly to that of the second embodiment.

Note that a counter circuit to adjust a signal change time (a time interval when the signals are asserted in the sequence of, for example, PSWCW to PSWCS to CLC (XCLC) to CLD (XCLD)) as depicted in FIG. 16 may be provided to each of the flip-flops 12, 41, 42, 31, and 32. Then, as depicted with dotted lines in FIG. 15, outputs from the corresponding counter circuits may be supplied as enable signals EN2, EN3A, EN3B, EN4A, and EN4B to the flip-flops 12, 41, 42, 31, and 32.

Accordingly, the time interval related to the control signals PSWCW, PSWCS, and the clamp signals CLC, XCLC, CLD, and XCLD may be adjusted more flexibly. For example, time is needed to charge in the large power domain, so that it makes it possible to perform control such that the time interval from the time when the control signal PSWCW is asserted to the time when the control signal PSWCS is asserted is made long. Note that control related to a count value of the counter circuit depicted in FIG. 16 makes a signal such as an INTVC [*] possible to be input to the counter circuit as a terminal, and it is also possible to control by the register from the outside and a clip process of the terminal, and the like.

Here, in the above-described respective embodiments, there is sometimes a case that the power supply and the power cut-off to the plurality of power domains are performed at the same timing in the case when, for example, power is supplied to the power domains at the same hierarchical level, or the like. If physical capacities of the power domains in which power is turned on/off at the same timing are not very large and power noise to be generated is small, an effect on other power domains is small. However, in the case when the physical capacities of the power domains in which power is turned on/off at the same timing are large, there is a fear that the power noise to be generated is amplified to be large, resulting that there is a possibility to cause erroneous operations to other power domains. A seventh embodiment and an eighth embodiment that are explained below are to prevent power in the plurality of power domains from being turned on/off at the same timing in order to suppress the power noise as described above.

Seventh Embodiment

Next, the seventh embodiment is explained.

Figure 17:
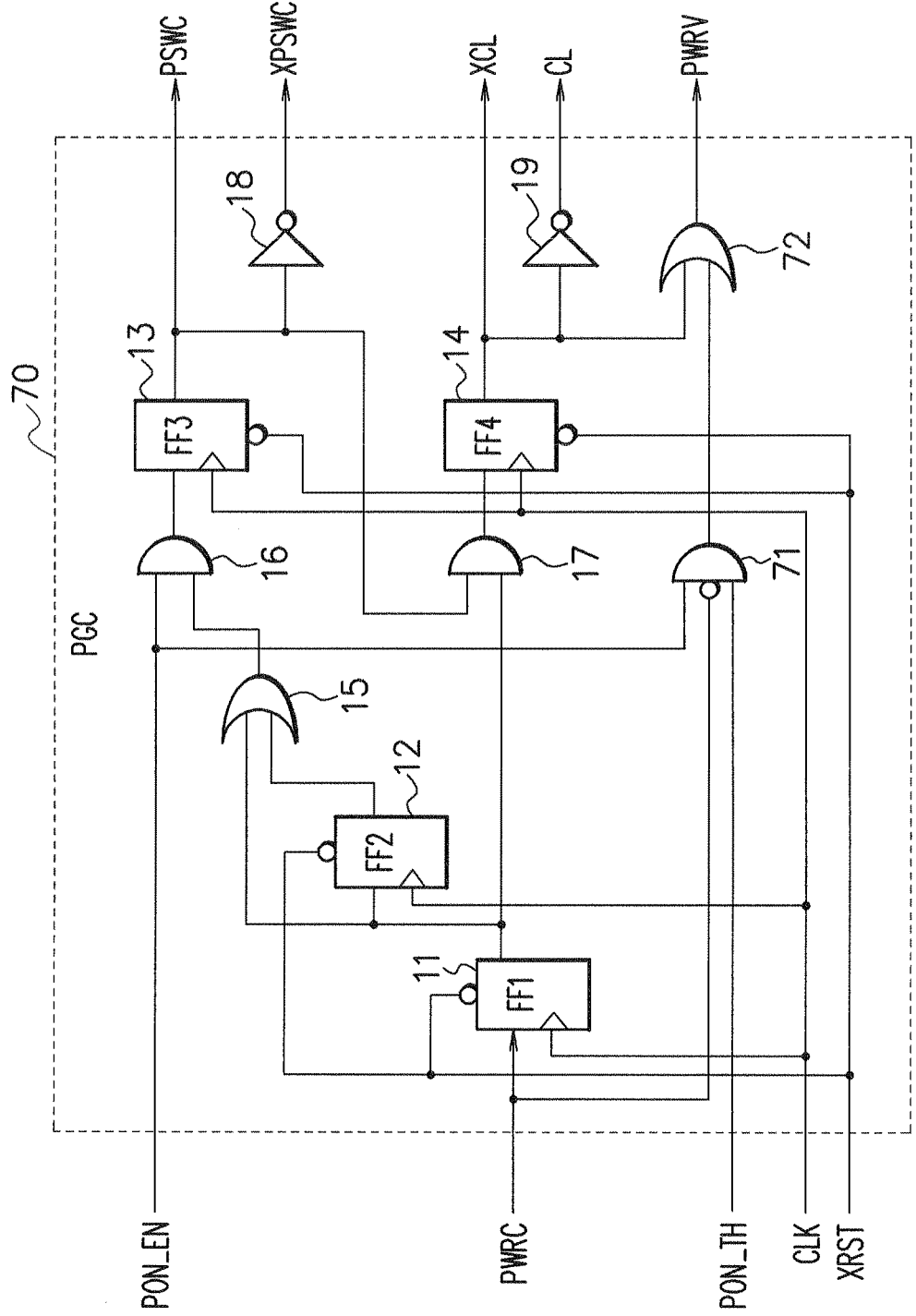
FIG. 17 is a circuit diagram depicting a configuration example of a power gating circuit in a seventh embodiment.

FIG. 17 is a circuit diagram depicting a configuration example of a power gating circuit (PGC) in the seventh embodiment. In FIG. 17, the same reference numerals and symbols are given to components the same as the component depicted in FIG. 3, and redundant explanation thereof is omitted.

As depicted in FIG. 17, a power gating circuit 70 includes the flip-flops 11, 12, 13, and 14, OR circuits 15 and 72, AND circuits 16, 17, and 71, and the inverters 18, 19. Further, the clock signal CLK, the reset signal XRST, the power-on/off control signal PWRC, the power supply enable signal PON_EN, and a pass permission signal PON_TH of the power supply enable signal are input to the power gating circuit 70.

The AND circuit 71 has the power supply enable signal PON_EN and the pass permission signal PON_TH input thereto, and has the power-on/off control signal PWRC input thereto in an inverted manner. Further, the OR circuit 72 has the output from the flip-flop 14 and an output from the AND circuit 71 input thereto, and an operation result thereof is output as the valid signal PWRV.

In the case when the pass permission signal PON_TH is at "L", the output from the AND circuit 71 turns to "L" regardless of the power supply enable signal PON_EN and the power-on/off control signal PWRC. Thus, the output from the flip-flop 14 is output as the valid signal PWRV.

On the other hand, in the case when the pass permission signal PON_TH is at "H", if the power-on/off control signal PWRC is at "H" (power-on), the output from the AND circuit 71 turns to "L". Thus, the output from the flip-flop 14 is output as the valid signal PWRV.

Further, in the case when the pass permission signal PON_TH is at "H", if the power-on/off control signal PWRC is at "L" (power-off), the output from the AND circuit 71 changes depending on the power supply enable signal PON_EN. Note that the power-on/off control signal PWRC is at "L", and thus the output from the flip-flop 14 is at "L". Accordingly, in the case when the pass permission signal PON_TH is at "H" and the power-on/off control signal PWRC is at "L", the output from the AND circuit 71, namely the power supply enable signal PON_EN is output as the valid signal PWRV.

That is, in the case when the pass permission signal PON_TH is at "L", the power gating circuit 70 similarly to the power gating circuit 10 in the first embodiment, outputs the valid signal PWRV depending on the power supply and the power cut-off to the power domain to be controlled. Further, the power gating circuit 70, in the case when the pass permission signal PON_TH is at "H", outputs the valid signal PWRV depending on the power supply enable signal PON_EN to be input even though the power supply to the power domain to be controlled is not performed (even though power is cut-off). Incidentally, when the power supply to the power domain to be controlled is performed in the case when the pass permission signal PON_TH is at "H", similarly to the power gating circuit 10 in the first embodiment, the valid signal PWRV is output.

Figure 18:
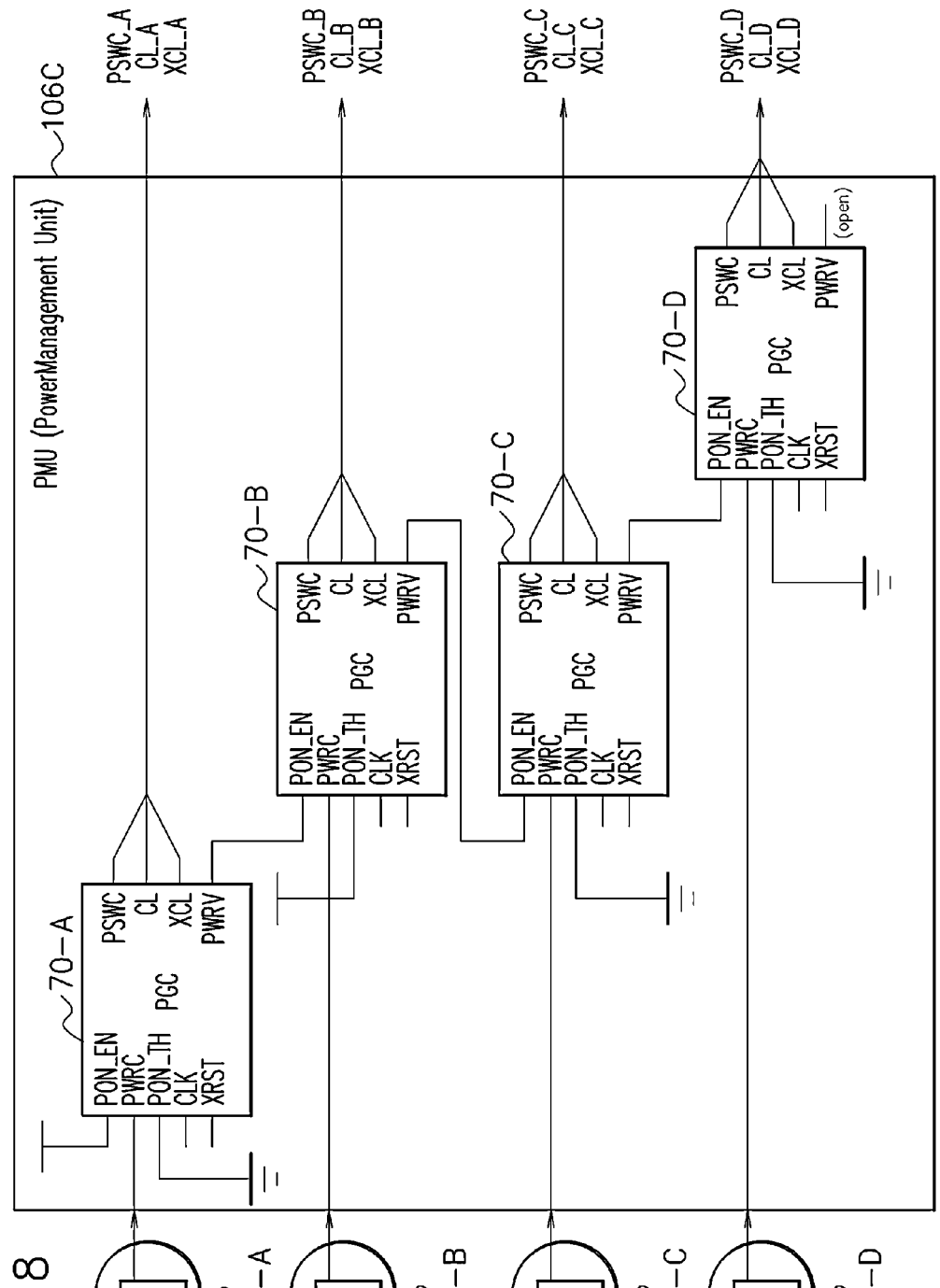
FIG. 18 is a view depicting a configuration example of a power management unit in the seventh embodiment.

FIG. 18 is a view depicting a configuration example of a power management unit 106C in the seventh embodiment. In FIG. 18, the power management unit 106C corresponding to the semiconductor device 101 depicted in FIG. 1 is depicted as one example. Further, in FIG. 18, the same reference numerals and symbols are given to components the same as the components depicted in FIG. 5, and redundant explanation thereof is omitted.

The power management unit 106C is configured to assign the single power gating circuit 70 to each of the power domain A 102 to the power domain D 105, and includes power gating circuits 70-A, 70-B, 70-C, and 70-D configured as depicted in FIG. 17. The power gating circuits 70-A to 70-D correspond to the power domain A 102 to the power domain D 105 respectively. The outputs from the on/off control circuits 108-A to 108-D related to the respective corresponding power domains are input to the power gating circuits 70-A to 70-D as the power-on/off control signal PWRC.

The power gating circuits 70-A to 70-D are connected in accordance with the inclusion relation (dependency relation) of the power domains in the semiconductor device 101. The power supply enable signal PON_EN input to the power gating circuit 70-A corresponding to the power domain A is clipped at "H".

As for the power gating circuits 70-B, 70-C corresponding to the power domain B, the power domain C inside the power domain A (included in the power domain A), it is connected so that the valid signal PWRV_A output from the power gating circuit 70-A is input to the power gating circuit 70-B corresponding to the power domain B as a power supply enable signal PON_EN_B. Further, a pass permission signal PON_TH input to the power gating circuit 70-B corresponding to the power domain B is clipped at "H". Further, it is connected so that the valid signal PWRV_B output from the power gating circuit 70-B is input to the power gating circuit 70-C corresponding to the power domain C as a power supply enable signal PON_EN_C.

It is connected so that the valid signal PWRV_C output from the power gating circuit 70-C is input to the power gating circuit 70-D corresponding to the power domain D inside the power domain C (included in the power domain C) as the power supply enable signal PON_EN_D. Note that pass permission signal PON_TH inputs to the power gating circuits 70-A, 70-C, and 70-D are clipped at "L".

As described above, in this embodiment, the valid signal PWRV outputs and the power supply enable signals PON_EN in the respective power gating circuits are connected so that the power gating circuits in the power management unit are connected sequentially (connected in cascade) depending on the inclusion relation of the power domains in the semiconductor device 101.

The power management unit 106C is configured by connecting the respective power gating circuits 70-A to 70-D as depicted in FIG. 18, and thereby the power supply is performed appropriately in the sequence of the power domain A to the power domain B to the power domain C to the power domain D at different timings depending on each of the power supply enable signal PON_EN inputs and power-on/off control signal PWRC inputs.

Figure 19A:
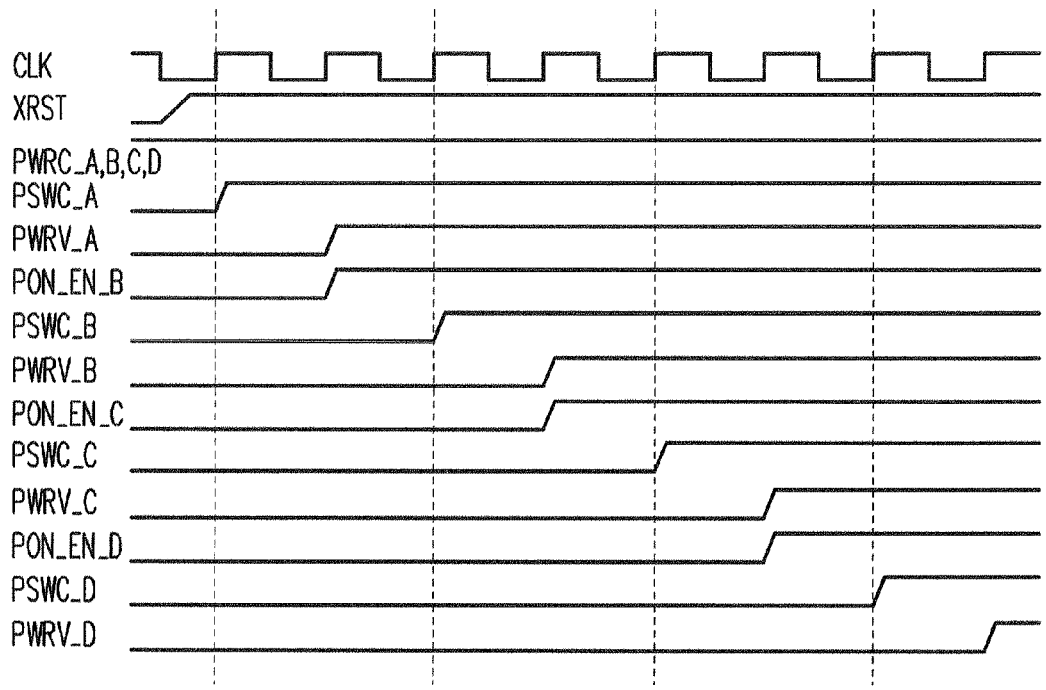
FIG. 19A and FIG. 19B are views depicting one example of operational waveforms of the power management unit depicted in FIG. 18.

For example, as depicted in FIG. 19A, in the case when all of power-on/off control signals PWRC_A, PWRC_B, PWRC_C, and PWRC_D are at "H", the control signal PSWC_A of the power switch related to the power domain A is first asserted. Thereafter, the valid signal PWRV_A related to the power domain A, namely the power supply enable signal PON_EN_B for the power domain B is asserted, and the control signal PSWC_B of the power switch related to the power domain B is asserted. Thereafter, the valid signal PWRV_B related to the power domain B, namely the power supply enable signal PON_EN_C for the power domain C is asserted, and the control signal PSWC_C of the power switch related to the power domain C is asserted. Subsequently, the valid signal PWRV_C related to the power domain C, namely the power supply enable signal PON_EN_D for the power domain D is asserted, and the control signal PSWC_D of the power switch related to the power domain D is asserted.

Figure 19B:
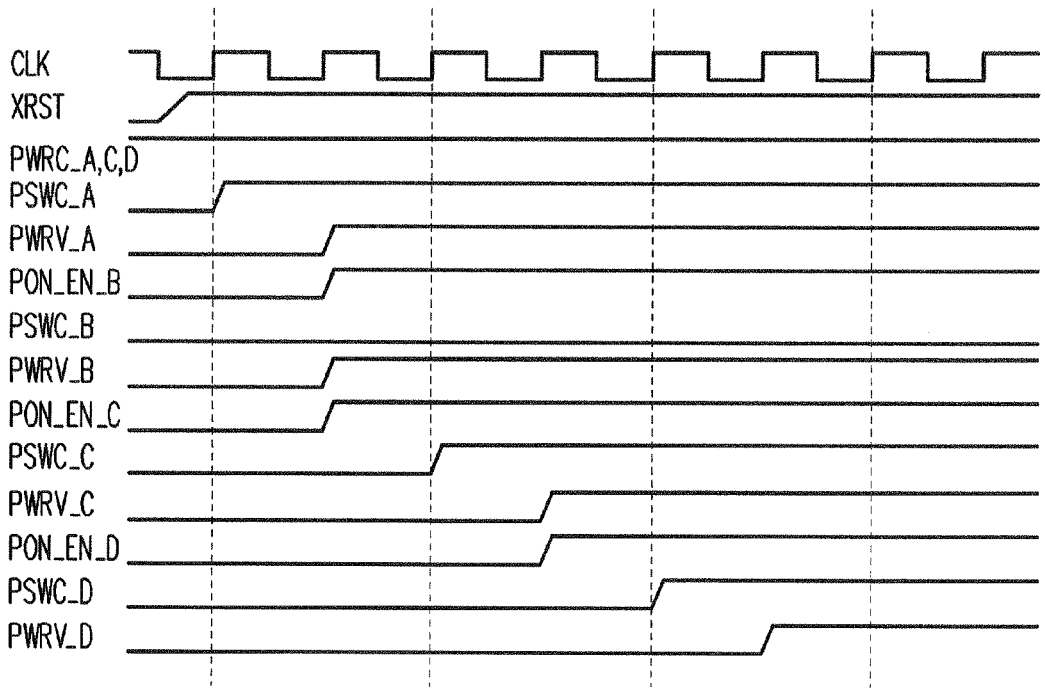

Further, as depicted in FIG. 19B, in the case when the power-on/off control signals PWRC_A, PWRC_C, and PWRC_D are at "H" and the power-on/off control signal PWRC_B is at "L", the control signal PSWC_A of the power switch related to the power domain A is first asserted. Thereafter, the valid signal PWRV_A related to the power domain A, namely the power supply enable signal PON_EN_B for the power domain B is asserted. At this time, the power-on/off control signal PWRC_B is at "L" and the pass permission signal PON_TH input to the power gating circuit 70-B is at "H", so that the power supply enable signal PON_EN_B passes and the valid signal PWRV_B related to the power domain B, namely the power supply enable signal PON_EN_C for the power domain C is immediately asserted. Thus, the control signal PSWC_C of the power switch related to the power domain C is asserted. Subsequently, the valid signal PWRV_C related to the power domain C, namely the power supply enable signal PON_EN_D for the power domain D is asserted, and the control signal PSWC_D of the power switch related to the power domain D is asserted.

Figure 20:
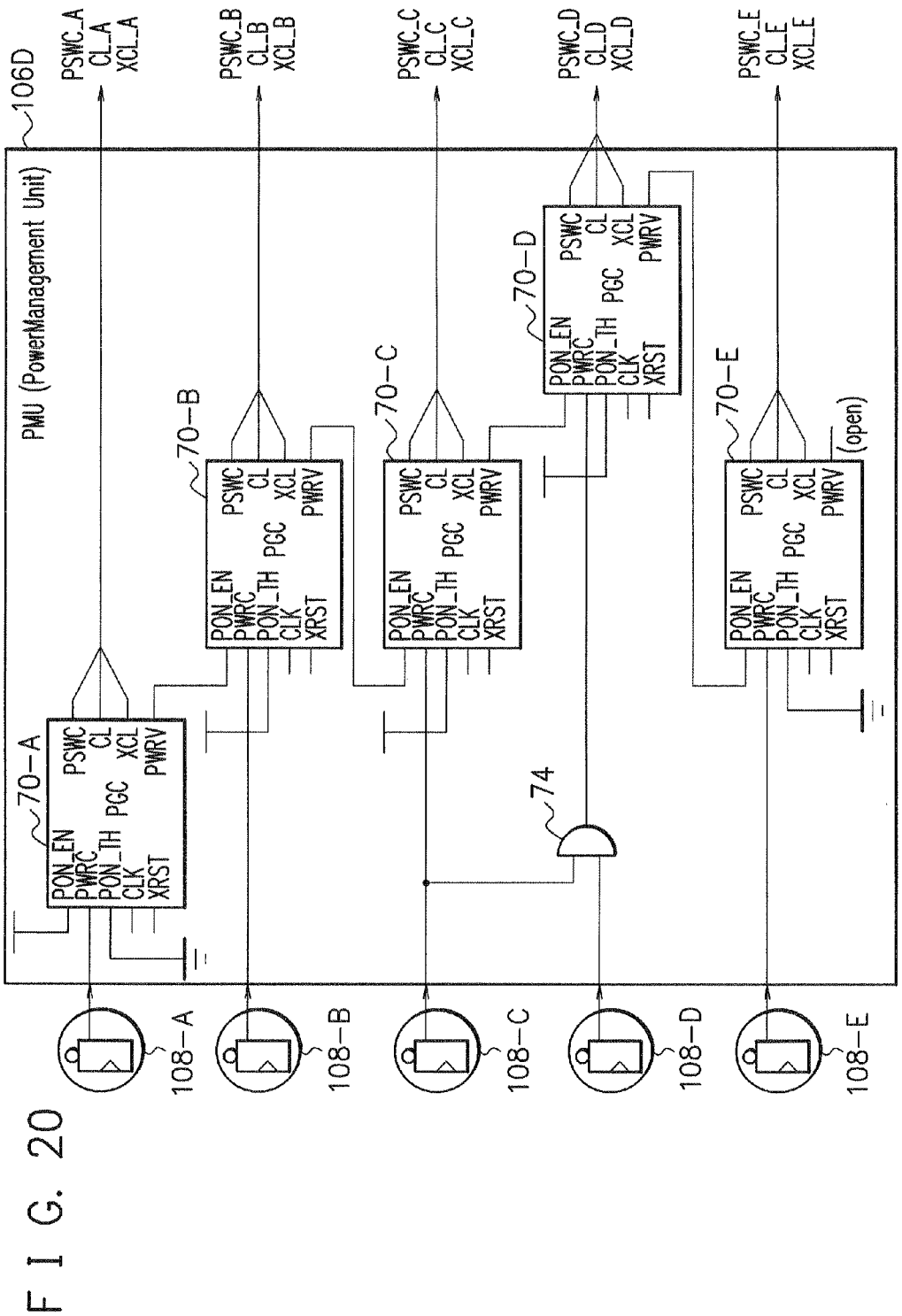
FIG. 20 is a view depicting another configuration example of the power management unit in the seventh embodiment.

FIG. 20 is a view depicting a configuration example of a power management unit 106D in the seventh embodiment. In FIG. 20, the same reference numerals and symbols are given to components the same as the components depicted in FIG. 5, and redundant explanation thereof is omitted.

The power management unit 106D depicted in FIG. 20 is to perform power control related to the power domain A to a power domain E, and is configured to assign the single power gating circuit 70 to each of the power domains. Incidentally, it is set that the power domain C includes the power domain D, and the power domain A includes the power domain B, the power domain C (including the power domain D), and the power domain E.

The power management unit 106D includes power gating circuits 70-A, 70-B, 70-C, 70-D, and 70-B corresponding to the power domain A to the power domain E respectively. Outputs from on/off control circuits 108-A to 108-E related to the respective corresponding power domains are input to the power gating circuits 70-A to 70-E as the power-on/off control signal PWRC. Note that an output from an AND circuit 74 where the outputs from the on/off control circuits 108-C and 108-D are input is input to the power gating circuit 70-D as the power-on/off control signal PWRC.

The power supply enable signal PON_EN input to the power gating circuit 70-A corresponding to the power domain A is clipped at "H". It is connected so that the valid signal PWRV_A output from the power gating circuit 70-A is input to the power gating circuit 70-B corresponding to the power domain B as the power supply enable signal PON_EN_B. The pass permission signal PON_TH input to the power gating circuit 70-B is clipped at "H". Further, it is connected so that the valid signal PWRV_B output from the power gating circuit 70-B is input to the power gating circuit 70-C corresponding to the power domain C as the power supply enable signal PON_EN_C. The pass permission signal PON_TH input to the power gating circuit 70-C is clipped at "H".

It is connected so that the valid signal PWRV_C output from the power gating circuit 70-C is input to the power gating circuit 70-D corresponding to the power domain D as the power supply enable signal PON_EN_D. The pass permission signal PON_TH input to the power gating circuit 70-D is clipped at "H". Further, it is connected so that the valid signal PWRV_D output from the power gating circuit 70-D is input to the power gating circuit 70-E as a power supply enable signal PON_ENE. Incidentally, the pass permission signal PON_TH input to the power gating circuit 70-A and a pass permission signal PON_TH input to the power gating circuit 70-E are clipped at "L".

The power management unit 106D is configured by connecting the respective power gating circuits 70-A to 70-E as depicted in FIG. 20, and thereby the power supply is performed appropriately in the sequence of the power domain A to the power domain B to the power domain C to the power domain D to the power domain E at different timings depending on each of the power supply enable signal PON_EN inputs and power-on/off control signal PWRC inputs.

Figure 21:
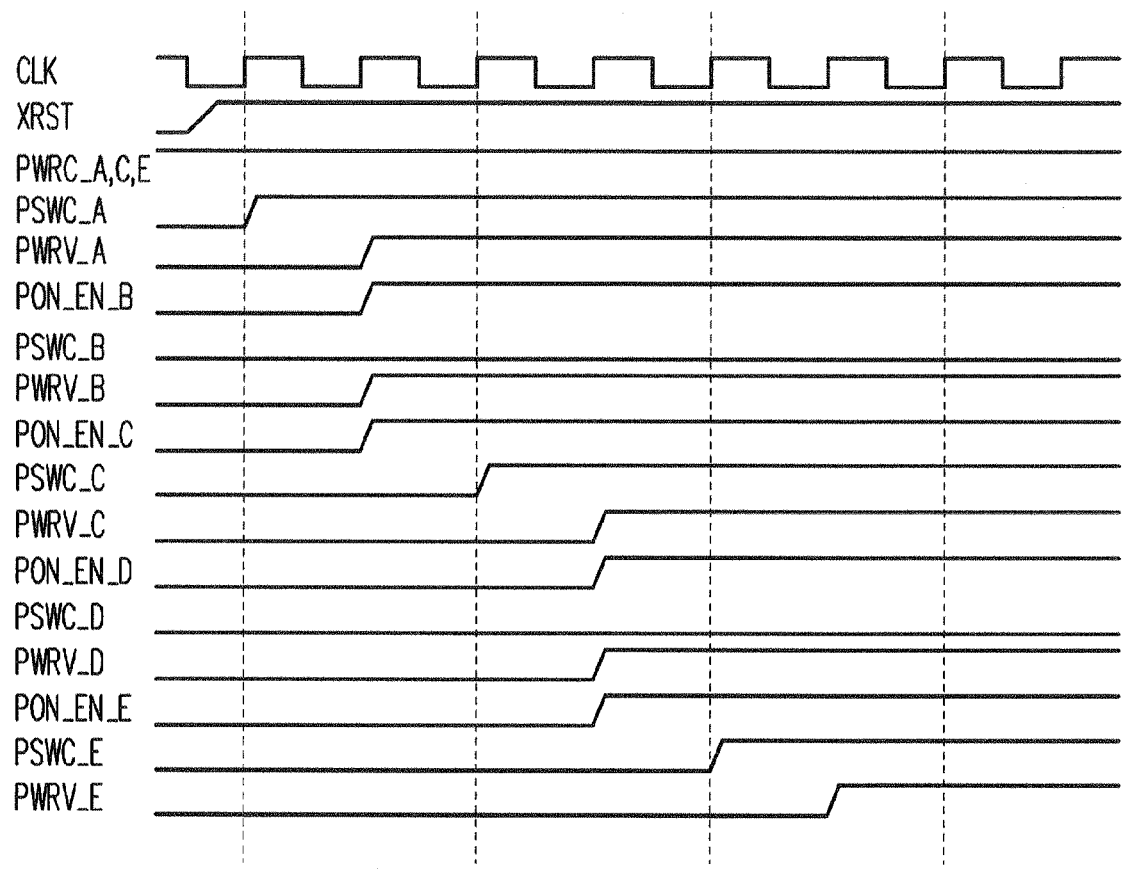
FIG. 21 is a view depicting one example of an operational waveform of the power management unit depicted in FIG. 20.

For example, as depicted in FIG. 21, in the case when the power-on/off control signals PWRC_A, PWRC_C, and PWRC_E are at "H" and the power-on/off control signals PWRC_B and PWRC_D are at "L", the control signal PSWC_A of the power switch related to the power domain A is first asserted.

Thereafter, the valid signal PWRV_A related to the power domain A, namely the power supply enable signal PON_EN_B for the power domain B is asserted. At this time, the power-on/off control signal PWRC_B is at "L" and the pass permission signal PON_TH input to the power gating circuit 70-B is at "H", so that the power supply enable signal PON_EN_B passes and the valid signal PWRV_B related to the power domain B, namely the power supply enable signal PON_EN_C for the power domain C is immediately asserted. Thus, the control signal PSWC_C of the power switch related to the power domain C is asserted.

Thereafter, the valid signal PWRV_C related to the power domain C, namely the power supply enable signal PON_EN_D for the power domain D is asserted, but the power-on/off control signal PWRC_D is at "L" and the pass permission signal PON_TH input to the power gating circuit 70-D is at "H". Thus, the power supply enable signal PON_EN_D passes and the valid signal PWRV_D related to the power domain D, namely the power supply enable signal PON_ENE for the power domain E is immediately asserted. Thereby, a control signal PSWC_E of a power switch related to the power domain E is asserted, and thereafter a valid signal PWRV_E related to the power domain E is asserted.

FIG. 22 is a view depicting a configuration example of a power management unit 106E in the seventh embodiment. In FIG. 22, the same reference numerals and symbols are given to components the same as the components depicted in FIG. 5 and FIG. 20, and redundant explanation thereof is omitted. Note that it is set that the power domain C includes the power domain D, and the power domain A includes the power domain B, the power domain C (including the power domain D), and the power domain E.

The power supply enable signal PON_EN input to the power gating circuit 70-A corresponding to the power domain A is clipped at "H". It is connected so that the valid signal PWRV_A output from the power gating circuit 70-A is input to the power gating circuit 70-B corresponding to the power domain B as the power supply enable signal PON_EN_B. The pass permission signal PON_TH input to the power gating circuit 70-B is clipped at "H". Further, it is connected so that the valid signal PWRV_B output from the power gating circuit 70-B is input to the power gating circuit 70-E corresponding to the power domain E as the power supply enable signal PON_EN_E. The pass permission signal PON_TH input to the power gating circuit 70-E is clipped at "H".

It is connected so that the valid signal PWRV_E output from the power gating circuit 70-E is input to the power gating circuit 70-C corresponding to the power domain C as the power supply enable signal PON_EN_C. Further, it is connected so that the valid signal PWRV_C output from the power gating circuit 70-C is input to the power gating circuit 70-D as the power supply enable signal PON_EN_D. Note that the pass permission signal PON_TH inputs to the power gating circuits 70-A, 70-C, and 70-D are clipped at "L".

The power management unit 106E is configured by connecting the respective power gating circuits 70-A to 70-E as depicted in FIG. 22, and thereby the power supply is performed appropriately in the sequence of the power domain A to the power domain B to the power domain E to the power domain C to the power domain D at different timings depending on each of the power supply enable signal PON_EN inputs and power-on/off control signal PWRC inputs.

Figure 23:
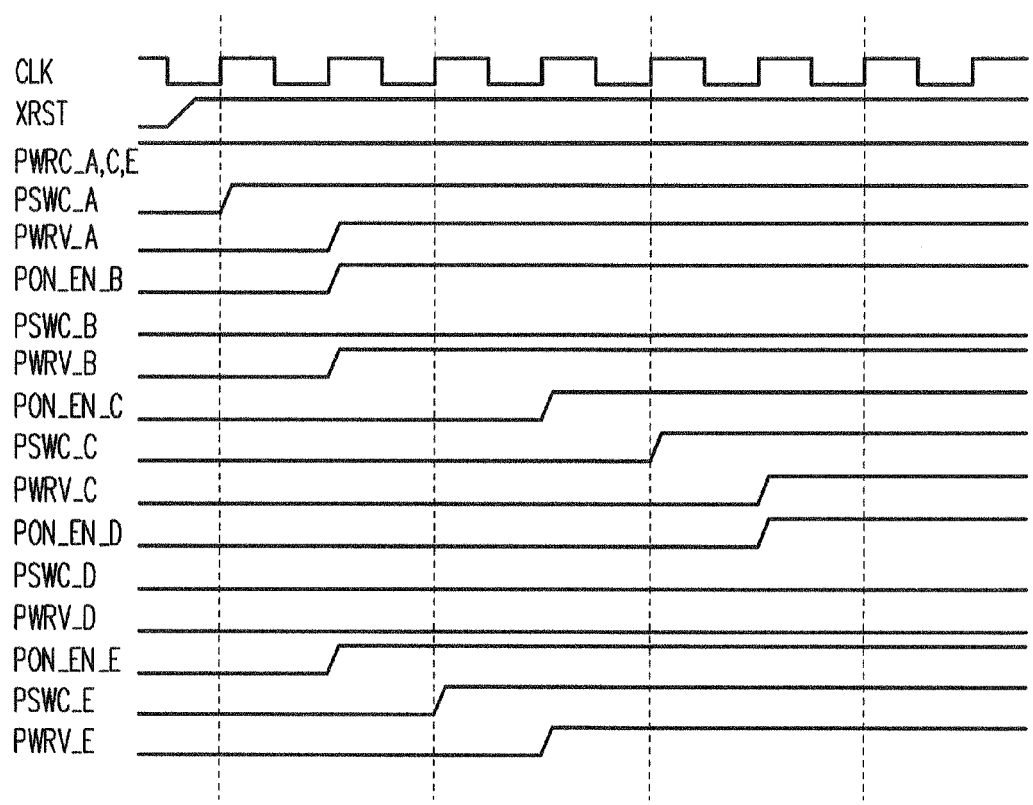
FIG. 23 is a view depicting one example of an operational waveform of the power management unit depicted in FIG. 22.

For example, as depicted in FIG. 23, in the case when the power-on/off control signals PWRC_A, PWRC_C, and PWRC_E are at "H" and the power-on/off control signals PWRC_B and PWRC_D are at "L", the control signal PSWC_A of the power switch related to the power domain A is first asserted.

Thereafter, the valid signal PWRV_A related to the power domain A, namely the power supply enable signal PON_EN_B for the power domain B is asserted, but the power-on/off control signal PWRC_B is at "L" and the pass permission signal PON_TH input to the power gating circuit 70-B is at "H". Thus, the power supply enable signal PON_EN_B passes, and the valid signal PWRV_B related to the power domain B, namely the power supply enable signal PON_EN_E for the power domain E is immediately asserted. Thereby, the control signal PSWC_E of the power switch related to the power domain E is asserted.

Thereafter, the valid signal PWRV_E related to the power domain E, namely the power supply enable signal PON_EN_C for the power domain C is asserted, and the control signal PSWC_C of the power switch related to the power domain C is asserted. Subsequently, the valid signal PWRV_C related to the power domain C, namely the power supply enable signal PON_EN_D for the power domain D is asserted.

According to this embodiment, it is set in such a manner that the power supply operation is performed only for the single power domain at a certain timing, and it makes it possible to prevent power from being supplied to the plurality of power domains at the same timing. Thus, the power management unit depending on the power control specification of the semiconductor device may be designed easily and the power noise to be generated by the power supply in the semiconductor device may be suppressed.

Eighth Embodiment

Next, the eighth embodiment is explained.

Figure 24:
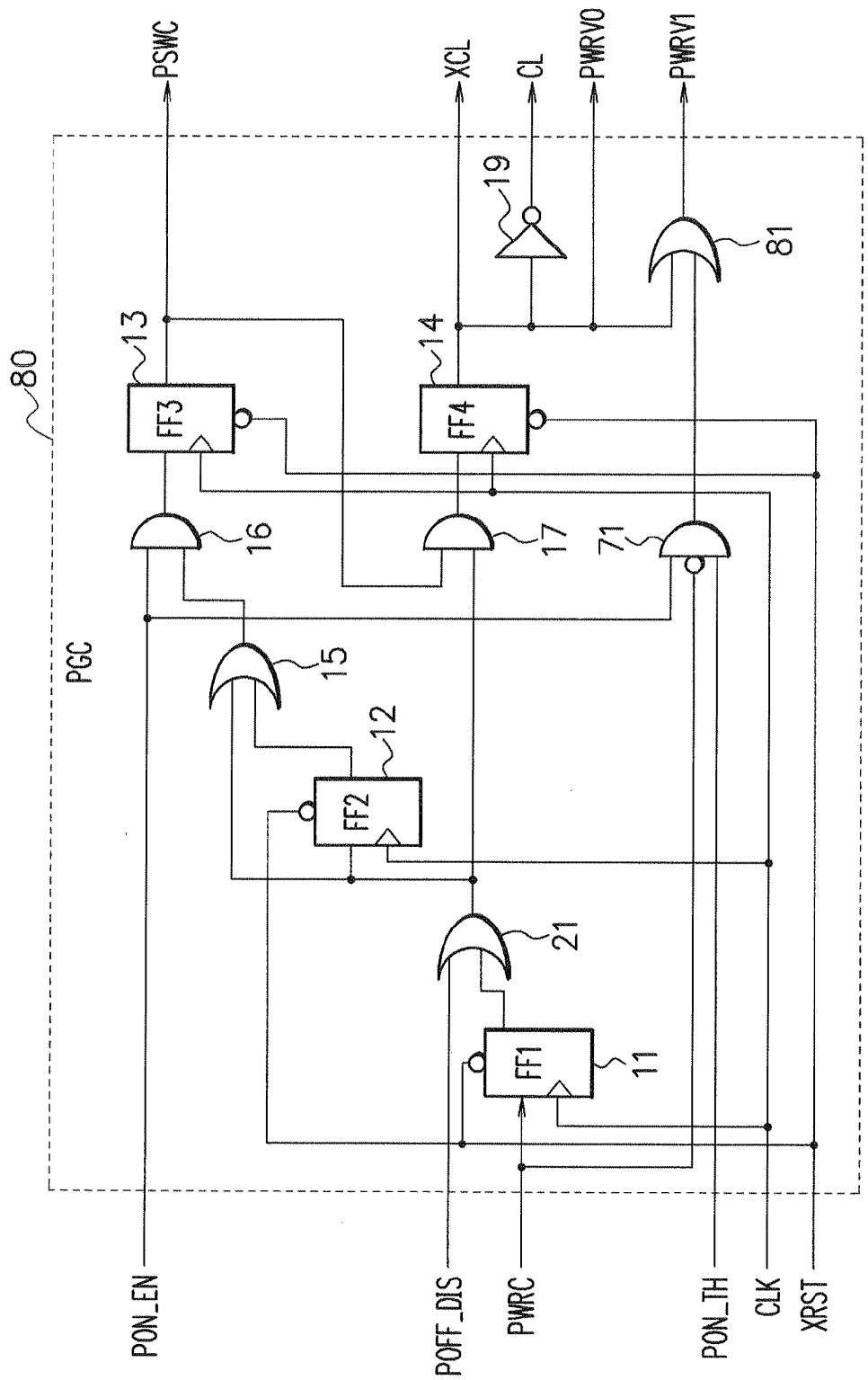
FIG. 24 is a circuit diagram depicting a configuration example of a power gating circuit in an eighth embodiment.

FIG. 24 is a circuit diagram depicting a configuration example of a power gating circuit (PGC) in the eighth embodiment. In FIG. 24, the same reference numerals and symbols are given to components the same as the component depicted in FIG. 7 and FIG. 17, and redundant explanation thereof is omitted.

As depicted in FIG. 24, a power gating circuit 80 includes the flip-flops 11, 12, 13, and 14, OR circuits 15, 21, and 81, the AND circuits 16, 17, and 71, and the inverter 19. Further, the clock signal CLK, the reset signal XRST, the power-on/off control signal PWRC, the power supply enable signal PON_EN, the power cut-off disable signal POFF_DIS, and the pass permission signal PON_TH of the power supply enable signal are input to the power gating circuit 80.

The OR circuit 81 has the output from the flip-flop 14 and the output from the AND circuit 71 input thereto, and an operation result thereof is output as a valid signal PWRV1. The valid signal PWRV1 corresponds to the valid signal PWRV depicted in FIG. 17. Further, the power gating circuit 80 outputs the output from the flip-flop 14 as a valid signal PWRV0.

The power gating circuit 80 in the eighth embodiment similarly to the power gating circuits 10 and 20 that are described above, outputs the valid signal PWRV0 depending on the power supply and the power cut-off to the power domain to be controlled. Further, the power gating circuit 80 similarly to the above-described power gating circuit 70, outputs the valid signal PWRV1. That is, in the case when the pass permission signal PON_TH is at "L", the power gating circuit 80 outputs the valid signal PWRV1 depending on the power supply and the power cut-off to the power domain to be controlled. In the case when the pass permission signal PON_TH is at "H", the power gating circuit 80 outputs the valid signal PWRV1 depending on the power supply enable signal PON_EN to be input if the power supply to the power domain to be controlled is not performed.

Figure 25:
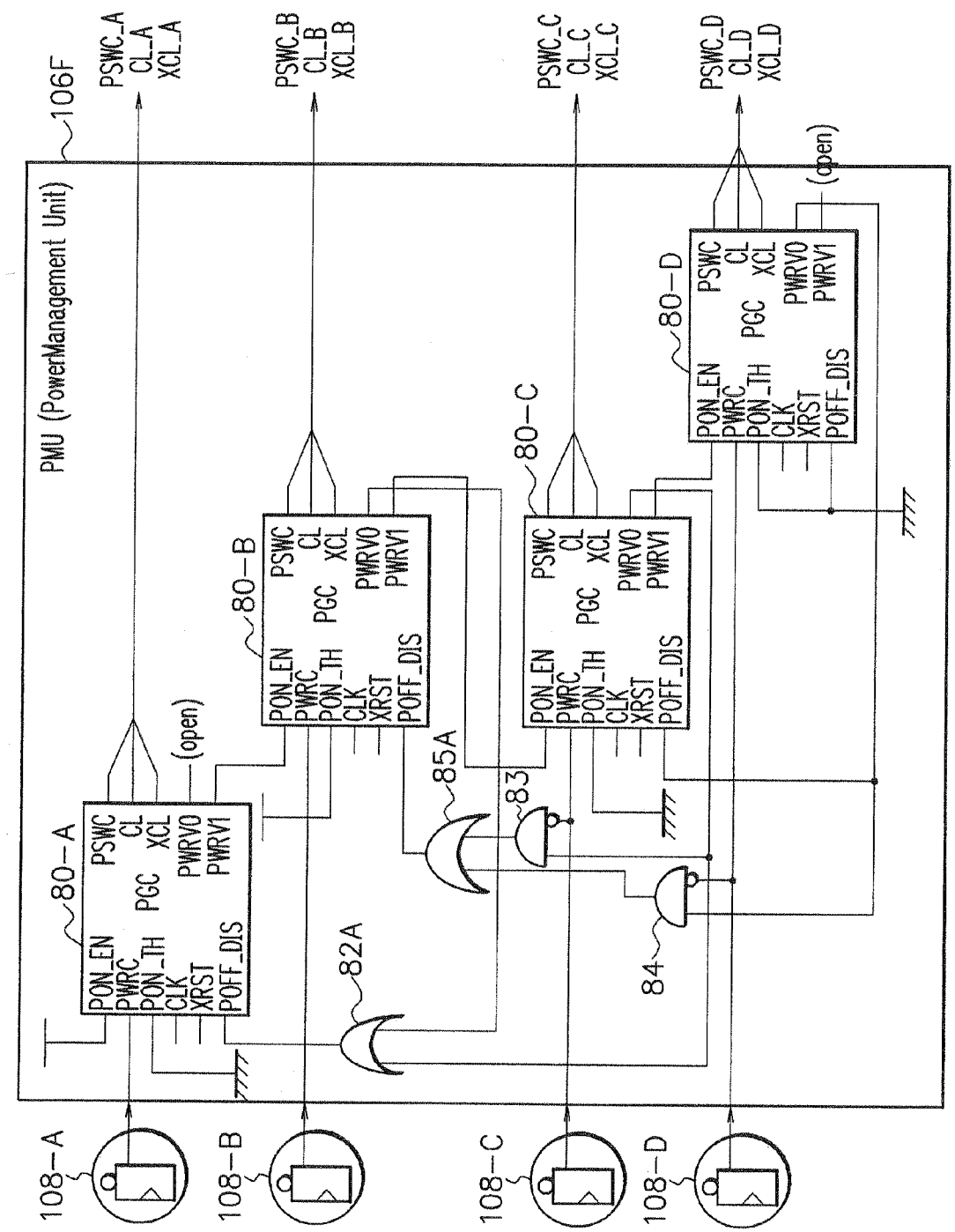
FIG. 25 is a view depicting a configuration example of a power management unit in the eighth embodiment.

FIG. 25 is a view depicting a configuration example of a power management unit 106F in the eighth embodiment. In FIG. 25, the power management unit 106F corresponding to the semiconductor device 101 depicted in FIG. 1 is depicted as one example. Further, in FIG. 25, the same reference numerals and symbols are given to components the same as the components depicted in FIG. 5 and FIG. 18, and redundant explanation thereof is omitted.

The power management unit 106F is configured to assign the single power gating circuit 80 to each of the power domain A 102 to the power domain D 105, and includes power gating circuits 80-A, 80-B, 80-C, and 80-D configured as depicted in FIG. 24. The power gating circuits 80-A to 80-D correspond to the power domain A 102 to the power domain D 105 respectively. The outputs from the on/off control circuits 108-A to 108-D related to the respective corresponding power domains are input to the power gating circuits 80-A to 80-D as the power-on/off control signal PWRC.

Further, similarly to the seventh embodiment depicted in FIG. 18, in the power gating circuits 80-A to 80-D, valid signal PWRV1 outputs and the power supply enable signal PON_EN inputs are connected depending on the inclusion relation (dependency relation) of the power domains in the semiconductor device 101.

Further, as depicted in FIG. 25, valid signal PWRV0 outputs and power cut-off disable signal POFF_DIS inputs are connected depending on the inclusion relation (dependency relation) of the power domains in the semiconductor device 101.

In the example depicted in FIG. 25, valid signals PWRV0_B and PWRV0_C output from the power gating circuits 80-B and 80-C corresponding to the power domain B and the power domain C are input to an OR circuit 82A. An output from the OR circuit 82A is input to the power gating circuit 80-A corresponding to the power domain A as the power cut-off disable signal POFF_DIS_A. Further, it is connected so that a valid signal PWRV0_D output from the power gating circuit 80-D corresponding to the power domain D is input to the power gating circuit 80-C corresponding to the power domain C as the power cut-off disable signal POFF_DIS_C.

Further, an AND circuit 83 has the valid signal PWRV0_C output from the power gating circuit 80-C input thereto, and has the power-on/off control signal PWRC_C input thereto in an inverted manner. Similarly, an AND circuit 84 has the valid signal PWRV0_D output from the power gating circuit 80-D input thereto, and has the power-on/off control signal PWRC_D input thereto in an inverted manner. An OR circuit 85A has an output from the AND circuit 83 and an output from the AND circuit 84 input thereto, and an operation result thereof is input to the power gating circuit 80-B as a power cut-off disable signal POFF_DIS_B.

The power management unit 106F is configured by connecting the respective power gating circuits 80-A to 80-D as depicted in FIG. 25, and thereby the power supply is performed appropriately in the sequence of the power domain A to the power domain B to the power domain C to the power domain D at different timings depending on each of the power supply enable signal PON_EN inputs and power-on/off control signal PWRC inputs. Further, the power cut-off is performed appropriately in the sequence of the power domain D to the power domain C to the power domain B to the power domain A at different timings depending on each of the power cut-off disable signal POFF_DIS inputs and power-on/off control signal PWRC inputs.

For example, in the case when all the power-on/off control signals PWRC_A, PWRC_B, PWRC_C, and PWRC_D change from "H" to "L" as depicted in FIG. 26, first, the valid signal PWRV0_D related to the power domain D, namely a power supply disable signal POFF_DIS_C for the power domain C is negated. Thereafter, the control signal PSWC_D of the power switch related to the power domain D is negated and the valid signal PWRV0_C related to the power domain C is negated, and thereby a power supply disable signal POFF_DIS_B for the power domain B is negated. Thereafter, the control signal PSWC_C of the power switch related to the power domain C is negated and the valid signal PWRV0_B related to the power domain B is negated, and then a power supply disable signal POFF_DIS_A for the power domain A is negated. Subsequently, the control signal PSWC_B of the power switch related to the power domain B is negated, and thereafter the control signal PSWC_A of the power switch related to the power domain A is negated.

Figure 27:
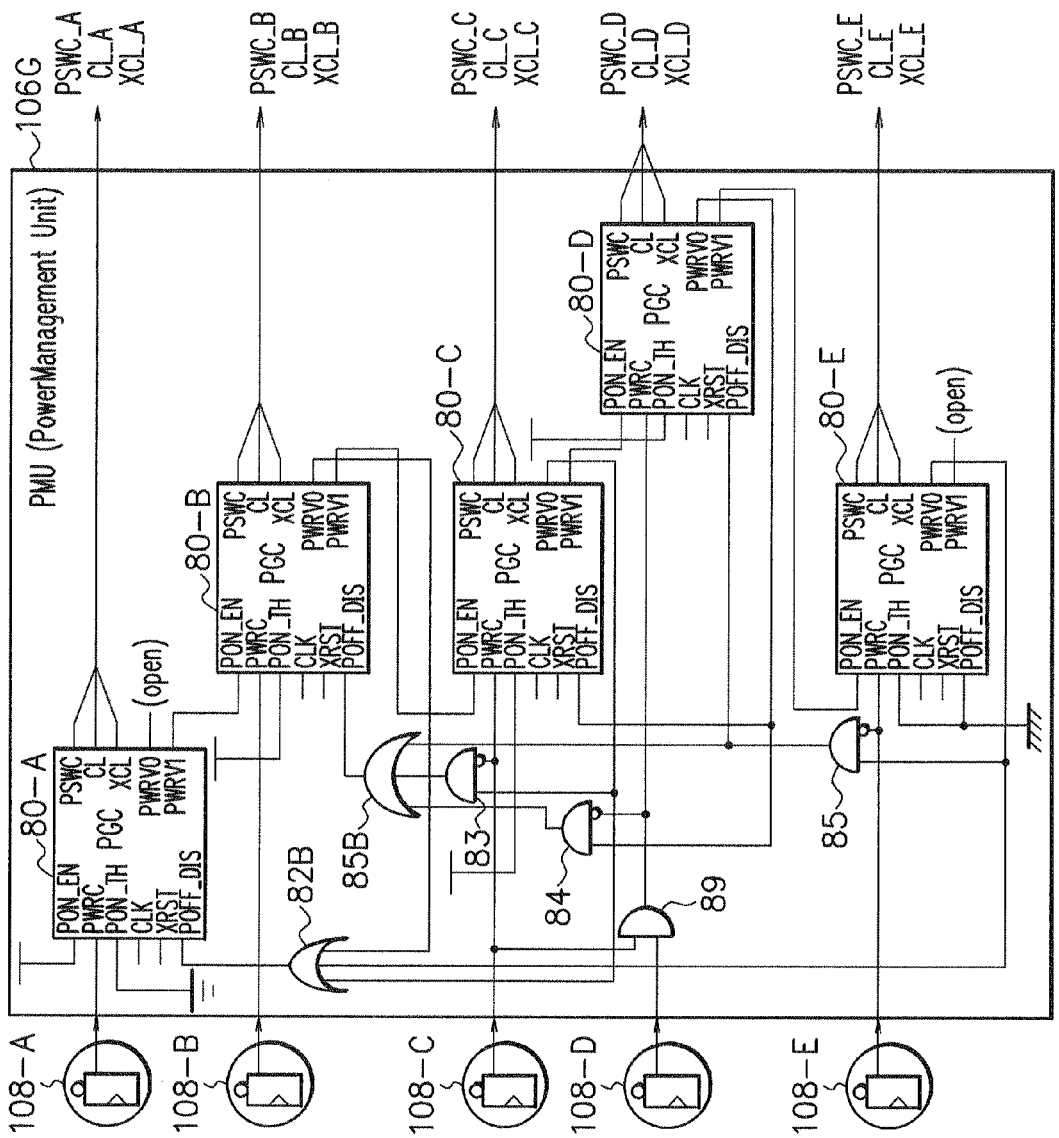
FIG. 27 is a view depicting another configuration example of the power management unit in the eighth embodiment.

FIG. 27 is a view depicting a configuration example of a power management unit 106G in the eighth embodiment. In FIG. 27, the same reference numerals and symbols are given to components the same as the components depicted in FIG. 5, FIG. 18, and FIG. 25, and redundant explanation thereof is omitted.

The power management unit 106G depicted in FIG. 27 is to perform power control related to the power domain A to the power domain E, and is configured to assign the single power gating circuit 80 to each of the power domains. Incidentally, it is set that the power domain C includes the power domain D, and the power domain A includes the power domain B, the power domain C (including the power domain D), and the power domain E.

The power management unit 106G includes power gating circuits 80-A, 80-B, 80-C, 80-D, and 80-B corresponding to the power domain A to the power domain E respectively. The outputs from the on/off control circuits 108-A to 108-E related to the respective corresponding power domains are input to the power gating circuits 80-A to 80-E as the power-on/off control signal PWRC. Note that an output from an AND circuit 89 where the outputs from the on/off control circuits 108-C and 108-D are input is input to the power gating circuit 80-D as the power-on/off control signal PWRC. The power supply enable signal PON_EN inputs and the valid signal PWRV1 outputs in the respective power gating circuits 80-A to 80-E are connected similarly to the power supply enable signal PON_EN inputs and the valid signal PWRV outputs in the respective power gating circuits 80-A to 80-E depicted in FIG. 20.

The valid signals PWRV0_B, PWRV0_C and PWRV0_E output from the power gating circuits 80-B, 80-C and 80-E are input to an OR circuit 82B, and an operation result thereof is input to the power gating circuit 80-A as the power cut-off disable signal POFF_DIS_A. Further, an AND circuit 85 has the valid signal PWRV0_E output from the power gating circuit 80-E input thereto, and has the power-on/off control signal PWRC_E input thereto in an inverted manner. The output from the AND circuit 83, the output from the AND circuit 84, and an output from the AND circuit 85 are input to an OR circuit 85B, and an operation result thereof is input to the power gating circuit 80-B as the power cut-off disable signal POFF_DIS_B. Further, the output from the AND circuit 85 is input to the power gating circuit 80-D as a power cut-off disable signal POFF_DIS_D.

The power management unit 106G is configured by connecting the respective power gating circuits 80-A to 80-E as depicted in FIG. 27, and thereby the power supply is performed appropriately in the sequence of the power domain A to the power domain B to the power domain C to the power domain D to the power domain E at different timings depending on each of the power supply enable signal PON_EN inputs and power-on/off control signal PWRC inputs. Further, the power cut-off is performed appropriately in the sequence of the power domain E to the power domain D to the power domain C to the power domain B to the power domain A at different timings depending on each of the power cut-off disable signal POFF_DIS inputs and power-on/off control signal PWRC inputs.

Figure 28:
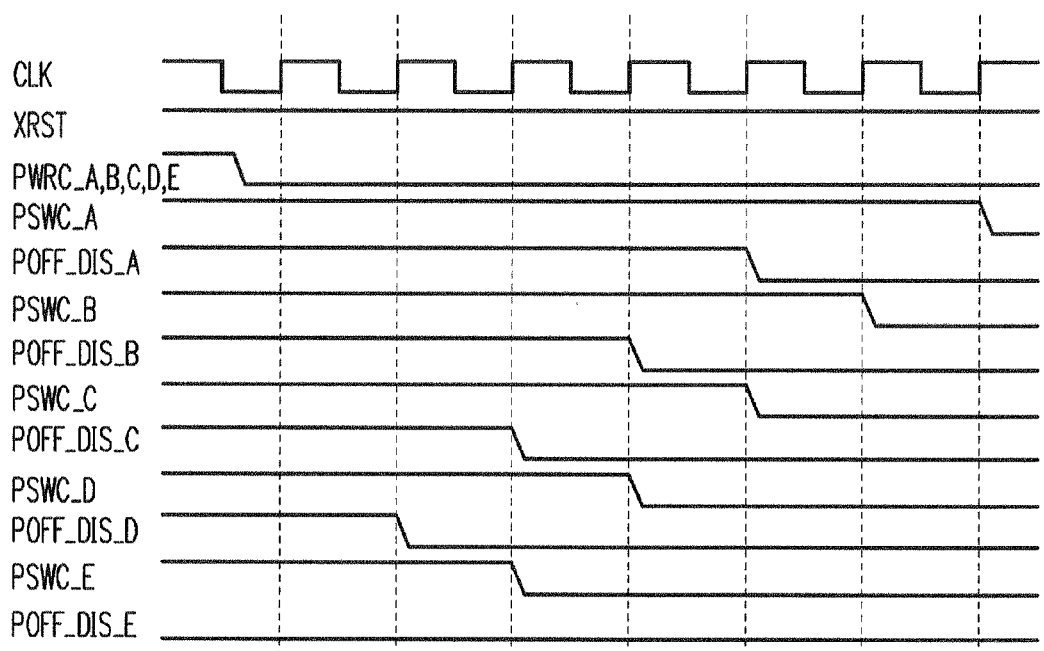
FIG. 28 is a view depicting one example of an operational waveform of the power management unit depicted in FIG. 27.

For example, in the case when all the power-on/off control signals PWRC_A, PWRC_B, PWRC_C, PWRC_D, and PWRC_E change from "H" to "L" as depicted in FIG. 28, the valid signal PWRV0_E related to the power domain E is first negated, and thereby a power supply disable signal POFF_DIS_D for the power domain D is negated. Thereafter, the control signal PSWC_E of the power switch related to the power domain E is negated, and the valid signal PWRV0_D related to the power domain D, namely the power supply disable signal POFF_DIS_C for the power domain C is negated. Thereafter, the control signal PSWC_D of the power switch related to the power domain D is negated and the valid signal PWRV0_C related to the power domain C is negated, and thereby the power supply disable signal POFF_DIS_B for the power domain B is negated. Thereafter, the control signal PSWC_C of the power switch related to the power domain C is negated and the valid signal PWRV0_B related to the power domain B is negated, and then the power supply disable signal POFF_DIS_A for the power domain A is negated. Subsequently, the control signal PSWC_B of the power switch related to the power domain B is negated, and thereafter the control signal PSWC_A of the power switch related to the power domain A is negated.

Note that an operation related to the power supply is similar to that in the power management unit 106D depicted in FIG. 20.

FIG. 29 is a view depicting a configuration example of a power management unit 106H in the eighth embodiment. In FIG. 29, the same reference numerals and symbols are given to components the same as the components depicted in FIG. 5, FIG. 25, and FIG. 27, and redundant explanation thereof is omitted. Incidentally, it is set that the power domain C includes the power domain D, and the power domain A includes the power domain B, the power domain C (including the power domain D), and the power domain E.

In the power management unit 106H, the power supply enable signal PON_EN inputs and the valid signal PWRV1 outputs in the respective power gating circuits 80-A to 80-E are connected similarly to the power supply enable signal PON_EN inputs and the valid signal PWRV outputs in the respective power gating circuits 80-A to 80-E depicted in FIG. 22.

A power cut-off disable signal POFF_DIS_D input to the power gating circuit 80-D is clipped at "L". The output from the AND circuit 83 and the valid signal PWRV0_D output from the power gating circuit 80-D are input to an OR circuit 86. An output from the OR circuit 86 is input to the power gating circuit 80-E as a power cut-off disable signal POFF_DIS_E. Further, the output from the AND circuit 85 and the output from the OR circuit 86 are input to an OR circuit 87, and an operation result thereof is input to the power gating circuit 80-B as the power cut-off disable signal POFF_DIS_B.

The power management unit 106H is configured by connecting the respective power gating circuits 80-A to 80-E as depicted in FIG. 29, and thereby the power supply is performed appropriately in the sequence of the power domain A to the power domain B to the power domain E to the power domain C to the power domain D at different timings depending on each of the power supply enable signal PON_EN inputs and power-on/off control signal PWRC inputs. Further, the power cut-off is performed appropriately in the sequence of the power domain D to the power domain C to the power domain E to the power domain B to the power domain A at different timings depending on each of the power cut-off disable signal POFF_DIS inputs and power-on/off control signal PWRC inputs.

For example, in the case when all the power-on/off control signals PWRC_A, PWRC_B, PWRC_C, PWRC_D, and PWRC_E change from "H" to "L" as depicted in FIG. 30, first, the valid signal PWRV0_D related to the power domain D, namely the power cut-off disable signal POFF_DIS_C for the power domain C is negated. Thereafter, the control signal PSWC_D of the power switch related to the power domain D is negated and the valid signal PWRV0_C related to the power domain C is negated, and thereby a power cut-off disable signal POFF_DIS_E for the power domain E is negated. Thereafter, the control signal PSWC_C of the power switch related to the power domain C is negated and the valid signal PWRV0_E related to the power domain E is negated, and thereby the power cut-off disable signal POFF_DIS_B for the power domain B is negated. Thereafter, the control signal PSWC_E of the power switch related to the power domain E is negated and the valid signal PWRV0_B related to the power domain B is negated, and then the power cut-off disable signal POFF_DIS_A for the power domain A is negated. Subsequently, the control signal PSWC_B of the power switch related to the power domain B is negated, and thereafter the control signal PSWC_A of the power switch related to the power domain A is negated.

Note that an operation related to the power supply is similar to that in the power management unit 106E depicted in FIG. 22.

According to this embodiment, it is set in such a manner that the power supply operation is performed only for the single power domain at a certain timing, and thereby it is possible to prevent power from being supplied to the plurality of power domains at the same timing. Further, it is set in such a manner that the power cut-off operation is performed only for the single power domain at a certain timing, and thereby it is possible to prevent the power cut-off to the plurality of power domains from being performed at the same timing. Thus, the power management unit depending on the power control specification of the semiconductor device may be designed easily and the power noise to be generated by the power supply and the power cut-off in the semiconductor device may be suppressed.

Note that in the above-described seventh and eighth embodiments, the cases where techniques described in the seventh and eighth embodiments are applied to the above-described first and second embodiments are described as one example, but the present embodiments are not limited to the above, and it is possible to apply the techniques described in the seventh and eighth embodiments to the above-described third to sixth embodiments as well.

The power management unit performing power supply control depending on the power control specification may be designed easily only by connecting the power gating circuits provided one by one corresponding to each of the power domains in accordance with the inclusion relation of the power domains.

Note that the above-described embodiments are to be considered in all respects as illustrative and no restrictive. Namely, the present embodiments may be embodied in other specific forms without departing from the spirit or essential characteristics thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a plurality of power domains, power of which is allowed to be on/off-controlled, including a first and a second power domains, the second power domain being not supplied with power during a time when the first power domain is not supplied with power, the second power domain being enabled to be supplied with power during a time when the first power domain is supplied with power, the first power domain being supplied with power before supplying power to the second power domain; and
   a power management unit configured to control power supply to the plurality of power domains, wherein the power management unit includes:
   a plurality of power controlling circuits assigned to the power domains, respectively, the plurality of power controlling circuits having a same circuit configuration as each other, each of the plurality of power controlling circuits configured to output a valid signal indicating that power is supplied to the assigned power domain, a first power controlling circuit of the plurality of power controlling circuits assigned to the first power domain, a second power controlling circuit of the plurality of power controlling circuits assigned to the second power domain, and wherein:
   the valid signal output from the first power controlling circuit is input to the second power controlling circuit as an enable signal allowing the second power controlling circuit to control power supply to the second power domain and to output the valid signal corresponding to the second power domain, and
   the valid signal output from the second power controlling circuit is input to the first power controlling circuit as a disable signal prohibiting a power cut-off of the first power domain.

2. The semiconductor device according to claim 1, wherein power is supplied to the second power domain depending on a signal requesting supply/cut-off of power to the second power domain during a time when the enable signal is asserted.

3. The semiconductor device according to claim 1, wherein power is cut off of power to the first power domain depending on a signal requesting supply/cut-off of power to the first power domain during a time when the disable signal is negated.

4. The semiconductor device according to claim 1, wherein each of the plurality of power controlling circuits comprises:
   an input terminal of the enable signal;
   an output terminal of the valid signal; and
   a path where the enable signal to be input to the input terminal is output from the output terminal as the valid signal depending on a pass permission signal, and the output terminal of the valid signal in the first power controlling circuit and the input terminal of the enable signal in the second power controlling circuit are connected in cascade.

5. The semiconductor device according to claim 4, wherein each of the plurality of power controlling circuits switches to allow or prohibit that the enable signal to be input is output as the valid signal based on a signal requesting supply/cut-off of power to the assigned power domain and the pass permission signal.

6. The semiconductor device according to claim 4, wherein:
each of the plurality of power controlling circuits includes an input terminal of the disable signal, and
the first power controlling circuit is supplied a signal indicating that power is supplied to the second power domain to the input terminal of the disable signal from the second power controlling circuit.

7. The semiconductor device according to claim 4, wherein in accordance with a sequence in which the first and second power controlling circuits are connected in cascade, timings are made different in the first and second power domains and the supply or cut-off of power is performed.

8. The semiconductor device according to claim 1, wherein when power supply to the assigned power domain is started, each of the plurality of power controlling circuits negates a clamp signal to clamp an output signal from the assigned power domain to a specified potential after asserting a control signal of a power switch to supply power to the assigned power domain.

9. The semiconductor device according to claim 1, further comprising:
two types of power switches configured to supply power to a single power domain of the power domains, and wherein
when power supply to the assigned power domain is started, each of the plurality of power controlling circuits controls to make a power switch of a second type in an on state after making a power switch of a first type in the on state, drive capability of the power switch of the second type being higher than that of the power switch of the first type.

10. The semiconductor device according to claim 9, wherein
each of the plurality of power controlling circuits controls to make the power switch of the first type in an off state after making the power switch of the second type in the on state.

11. The semiconductor device according to claim 10, wherein each of the plurality of power controlling circuits is capable of switching to make the power switch of the first type in the off state or maintain the power switch of the first type in the on state after making the power switch of the second type in the on state.

12. The semiconductor device according to claim 1 further comprising:
a counter circuit to adjust a time interval between respective signals output from each of the plurality of power controlling circuits.

13. The semiconductor device according to claim 1, further comprising:
a plurality of power switches, assigned to each of the power domains, configured to control supply/cut-off of power to the assigned power domain based on a control signal output from the plurality of power controlling circuits, and
wherein each of the plurality of power controlling circuits output the control signal to the power switch.

14. The semiconductor device according to claim 1, wherein the plurality of power domains further include a third power domain, the second and the third power domains being not supplied with power during a time when the first power domain is not supplied with power, the second and the third power domains being enabled to be supplied with power during a time when the first power domain is supplied with power, the third power domain being supplied with power independently of the second power domain, the first power domain being supplied with power before supplying power to at least one of the second or the third power domain, a third power controlling circuit of the plurality of power controlling circuits being assigned to the third power domain, wherein the valid signal output from the first power controlling circuit is input to the second and the third power controlling circuits as an enable signal allowing the each of the second and the third power controlling circuits to control power supply to the assigned power domain independently of the other.

15. The semiconductor device according to claim 14, wherein the plurality of power domains further include a fourth power domain, the fourth power domain being not supplied with power during a time when the second power domain is not supplied with power, the fourth power domain being enabled to be supplied with power during a time when the second power domain is supplied with power, the fourth power domain being supplied with power independently of the third power domain, the second power domain being supplied with power before supplying power to the fourth power domain, a fourth power controlling circuit of the plurality of power controlling circuits being assigned to the fourth power domain, wherein the valid signal output from the second power controlling circuit is input to the fourth power controlling circuit as an enable signal allowing the fourth power controlling circuit to control power supply to the fourth power domain, and wherein the valid signal output from the third power controlling circuit is not input to the fourth power controlling circuit.

16. A semiconductor device comprising:
a plurality of power domains, power of which is allowed to be on/off-controlled, including a first and a second power domains, the second power domain being not supplied with power during a time when the first power domain is not supplied with power, the second power domain being enabled to be supplied with power during a time when the first power domain is supplied with power, the first power domain being supplied with power before supplying power to the second power domain; and
a power management unit configured to control power supply to the plurality of power domains, wherein
the power management unit includes:
a plurality of power controlling circuits assigned to the power domains, respectively, the plurality of power controlling circuits having a same circuit configuration as each other, each of the plurality of power controlling circuits configured to output a valid signal indicating that power is supplied to the assigned power domain, a first power controlling circuit of the plurality of power controlling circuits assigned to the first power domain, a second power controlling circuit of the plurality of power controlling circuits assigned to the second power domain, wherein:
the valid signal output from the first power controlling circuit is input to the second power controlling circuit as an enable signal allowing the second power controlling circuit to control power supply to the second power domain and to output the valid signal corresponding to the second power domain, and
each of the plurality of power controlling circuits outputs a clamp signal for a clock signal and a clamp signal for a data signal of the assigned power domain, and when power supply to the assigned power domain is started, each of the plurality of power controlling circuits negates the clamp signal for the data signal after negating the clamp signal for the clock signal.

17. A semiconductor device controlling power supply to a plurality of power domains, power of which is allowed to be on/off-controlled, the plurality of power domains including a first and a second power domains, the second power domain being not supplied with power during a time when the first power domain is not supplied with power; the second power domain being enabled to be supplied with power during a time when the first power domain is supplied with power, the first power domain being supplied with power before supplying power to the second power domain, the semiconductor device comprising:

a plurality of power controlling circuits assigned to the power domains, respectively, the plurality of power controlling circuits having a same circuit configuration as each other, each of the plurality of power controlling circuits configured to output a valid signal indicating that power is supplied to the assigned power domain, a first power controlling circuit of the plurality of power controlling circuits assigned to the first power domain, a second power controlling circuit of the plurality of power controlling circuits assigned to the second power domain, wherein the valid signal output from the first power controlling circuit is input to the second power controlling circuit as an enable signal allowing the second power controlling circuit to control power supply to the second power domain and to output the valid signal corresponding to the second power domain, wherein the valid signal output from the second power controlling circuit is input to the first power controlling circuit as a disable signal prohibiting a power cut-off of the first power domain.

18. The semiconductor device according to claim 17, wherein
each of the plurality of power controlling circuits outputs a clamp signal for a clock signal and a clamp signal for a data signal of the assigned power domain.

* * * * *